US007569316B2

(12) United States Patent

Kazmaier et al.

(10) Patent No.: US 7,569,316 B2
(45) Date of Patent: *Aug. 4, 2009

(54) INKLESS REIMAGEABLE PRINTING PAPER AND METHOD

(75) Inventors: Peter M. Kazmaier, Mississauga (CA); Gabriel Iftime, Mississauga (CA); Tyler B. Norsten, Oakville (CA); Barkev Keoshkerian, Thornhill (CA); Naveen Chopra, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/762,311

(22) Filed: Jun. 13, 2007

(65) Prior Publication Data

US 2008/0311521 A1 Dec. 18, 2008

(51) Int. Cl.
*G03F 7/00* (2006.01)
*G03F 7/004* (2006.01)

(52) U.S. Cl. ................. 430/19; 430/270.1; 430/270.15; 430/30; 359/296

(58) Field of Classification Search .............. 430/270.1, 430/30, 19; 359/296
See application file for complete search history.

(56) References Cited

U.S. PATENT DOCUMENTS

| | | | | |
|---|---|---|---|---|
| 3,825,427 A | | 7/1974 | Inoue et al. | |
| 3,877,941 A | | 4/1975 | Lohmann | |
| 3,961,948 A | | 6/1976 | Saeva | 430/50 |
| 4,425,161 A | | 1/1984 | Shibahashi et al. | |
| 4,598,035 A | * | 7/1986 | Usami et al. | 503/213 |
| 4,659,649 A | | 4/1987 | Dickinson et al. | |
| 4,931,337 A | | 6/1990 | Miyazaki et al. | |
| 5,124,236 A | * | 6/1992 | Yamaguchi et al. | 430/281.1 |
| 5,262,280 A | | 11/1993 | Knudsen et al. | |
| 5,376,511 A | | 12/1994 | Tatezono et al. | |
| 5,458,874 A | | 10/1995 | Pereira et al. | |
| 5,677,107 A | | 10/1997 | Neckers | |
| 5,691,100 A | | 11/1997 | Kudo et al. | |
| 5,691,395 A | | 11/1997 | Knudsen et al. | |
| 6,067,185 A | | 5/2000 | Albert et al. | 359/296 |
| 6,103,378 A | * | 8/2000 | Yao et al. | 428/402.2 |

(Continued)

FOREIGN PATENT DOCUMENTS

CA 2 053 094 A1 4/1992

(Continued)

OTHER PUBLICATIONS

M. Irie, "Diarylethense for Memories and Switches," Chem Reviews, 100, pp. 1685-1716 (2000).

(Continued)

*Primary Examiner*—Amanda C. Walke
(74) *Attorney, Agent, or Firm*—Oliff & Berridge, Plc.

(57) ABSTRACT

An image forming medium includes a substrate, and an imaging layer coated on or impregnated into said substrate, wherein the imaging layer includes an imaging composition including a photochromic or photochromic-thermochromic material dissolved or dispersed in a solvent or polymeric binder, wherein the imaging composition is imageable by light of a first wavelength and erasable in a short time period by a combination of heat and light of a second wavelength such that simultaneous erase with heat and light of the second wavelength is faster than erase by heat alone and exhibits a reversible transition between a colorless and a colored state.

24 Claims, 4 Drawing Sheets

U.S. PATENT DOCUMENTS

| | | | | |
|---|---|---|---|---|
| 6,200,646 | B1 | 3/2001 | Neckers et al. | |
| 6,528,221 | B2 | 3/2003 | Takezawa et al. | |
| 6,579,662 | B1 | 6/2003 | Zheng et al. | |
| 6,680,281 | B2 * | 1/2004 | Tajiri et al. | 503/209 |
| 6,761,758 | B2 | 7/2004 | Boils-Boissier et al. | |
| 6,866,981 | B2 | 3/2005 | Furukawa et al. | |
| 6,867,408 | B1 | 3/2005 | Gu et al. | |
| 6,906,118 | B2 | 6/2005 | Goodbrand et al. | |
| 7,018,714 | B2 | 3/2006 | Kobayashi et al. | |
| 7,057,054 | B2 | 6/2006 | Irie et al. | |
| 7,205,088 | B2 | 4/2007 | Iftime et al. | 430/270.1 |
| 7,214,456 | B2 | 5/2007 | Iftime et al. | 430/19 |
| 7,229,740 | B2 | 6/2007 | Iftime et al. | 430/270.1 |
| 7,256,921 | B2 | 8/2007 | Kumar et al. | |
| 7,332,257 | B2 | 2/2008 | Miyako et al. | |
| 7,381,506 | B2 | 6/2008 | Iftime et al. | |
| 7,441,887 | B2 | 10/2008 | Senga et al. | |
| 2002/0160318 | A1 | 10/2002 | Richter et al. | |
| 2003/0130456 | A1 | 7/2003 | Kim et al. | |
| 2005/0012998 | A1 | 1/2005 | Kumar et al. | |
| 2005/0244744 | A1 | 11/2005 | Kazmaier et al. | 430/270.1 |
| 2005/0269556 | A1 | 12/2005 | Evans et al. | |
| 2006/0001944 | A1 * | 1/2006 | Chopra et al. | 359/265 |
| 2006/0222972 | A1 | 10/2006 | Chopra et al. | |
| 2006/0222973 | A1 | 10/2006 | Iftime et al. | 430/19 |
| 2006/0236470 | A1 | 10/2006 | Sabnis et al. | |
| 2006/0251988 | A1 | 11/2006 | Iftime et al. | 430/270.1 |
| 2006/0257785 | A1 | 11/2006 | Johnson | |
| 2007/0054215 | A1 * | 3/2007 | Iftime et al. | 430/270.1 |
| 2007/0072110 | A1 | 3/2007 | Iftime et al. | 430/270.1 |
| 2007/0112103 | A1 | 5/2007 | Zhou et al. | |

FOREIGN PATENT DOCUMENTS

| | | | |
|---|---|---|---|
| EP | 1 367 111 | | 12/2003 |
| EP | 1 405 891 | | 4/2004 |
| EP | 1 591 829 | | 11/2005 |
| EP | 1 591 831 | | 11/2005 |
| FR | 2774998 | | 8/1999 |
| GB | 2 430 257 | | 3/2007 |
| JP | 57-136645 | | 8/1982 |
| JP | A-61-175087 | | 8/1986 |
| JP | A-5-265129 | | 10/1993 |
| JP | A-11-30835 | | 2/1999 |
| JP | A-2002-240441 | | 8/2002 |
| JP | A-2002-285146 | | 10/2002 |
| JP | 2003255490 | A * | 9/2003 |
| JP | A-2003-255489 | | 9/2003 |
| JP | A-2003-255490 | | 9/2003 |
| JP | A-2004-039009 | | 2/2004 |
| JP | A-2004-045037 | | 2/2004 |
| JP | A-2004-091638 | | 3/2004 |
| JP | A-2004-149501 | | 5/2004 |
| JP | A-2004-256780 | | 9/2004 |
| JP | A-2005-082507 | | 3/2005 |
| JP | A-2005-250463 | | 9/2005 |
| WO | WO 97/31033 | | 8/1997 |
| WO | WO 00/16985 | A1 | 3/2000 |
| WO | WO 2006/039130 | A1 | 4/2006 |
| WO | WO 2008/043853 | A2 | 4/2008 |

OTHER PUBLICATIONS

Kentaro Morimitsu et al., "Dithienylethenes With a Novel Photochromic Performance," J. Org. Chem., vol. 67, pp. 4574-4578 (2002).

U.S. Appl. No. 11/762,152, filed Jun. 13, 2007, to Iftime et al.

U.S. Appl. No. 11/762,327, filed Jun. 13, 2007, to Iftime et al.

U.S. Appl. No. 11/762,147, filed Jun. 13, 2007, to Iftime et al.

U.S. Appl. No. 11/762,098, filed Jun. 13, 2007, to Iftime et al.

U.S. Appl. No. 11/762,157, filed Jun. 13, 2007, to Iftime et al.

U.S. Appl. No. 11/762,153, filed Jun. 13, 2007, to Iftime et al.

U.S. Appl. No. 11/762,144, filed Jun. 13, 2007, to Kazmaier et al.

U.S. Appl. No. 11/762,150, filed Jun. 13, 2007, to Norsten et al.

U.S. Appl. No. 11/762,107, filed Jun. 13, 2007, to Iftime et al.

U.S. Appl. No. 11/762,176, filed Jun. 13, 2007, to Norsten et al.

U.S. Appl. No. 11/762,307, filed Jun. 13, 2007, to Norsten et al.

U.S. Appl. No. 11/762,159, filed Jun. 13, 2007, to Kazmaier et al.

U.S. Appl. No. 11/762,311, filed Jun. 13, 2007, to Kazmaier et al.

Wojtyk et al., "Effects of metal ion complexation on the spiropyran-merocyanine interconversion: development of a thermally stable photo-switch," J. Chem. Soc. Chem, Comm., pp. 1703-1704, 1998.

"Dolch Introduces World's First Ruggedized Notebook with Integrated Printer" available at http://news.thomasnet.com/fullstory/7005/447, pp. 1-4, Feb. 6, 2002.

Masamitsu Shirai et al., "Photoacid and Photobase Generators: Chemistry and Applications to Polymeric Materials," *Prog. Polym. Sci*. vol. 21, pp. 1-45 (1996).

T. Hirose et al., "Self-Assembly of Photochromic Diarylethenes With Amphiphilic Side Chains: Reversible Thermal and Photochemical Control," J. Org. Chem., 71, pp. 7499-7508 (2006).

T. Norsten et al., "Photoregulation of Fluorescence in a Porphyrinic Dithienylethene Photochrome," J. Am. Chem. Soc., 123(8), pp. 1784-1785 (2001).

Vladimir I. Minkin, "Photo-, Thermo-, Solvato-, and Electrochromic Spiroheterocyclic Compounds," Chemical Reviews, 104, 5, pp. 2751-2776 (2004).

Takayuki Suzuki et al., "Stabilization of the merocyanine form of photochromic compounds in fluoro alcohols is due to a hydrogen bond", Chem. Commun., 2685-2686 (1998).

Ronald F.M. Lange et al., "Supramolecular polymer interactions based on the alternating copolymer of styrene and Maleimide" Macromolecules, 28, 782-783 (1995).

Vladimir I. Minkin et al., "Perimidine spirocyclohexa dienones" in Organic Photochromic and Thermochromic Compounds, V1, Plenum Press, pp. 315-340 (1999).

John Biteau et al., "Photochromism of Spirooxazine-Doped Gels," J. Phys. Chem., 100, 9024-9031 (1996).

Leonard J. Prins et al., "Noncovalent Synthesis Using Hydrogen Bonding," Angew. Chem. Int. Ed., 40, 2382-2426 (2001).

Terry M. Cresp et al., "A Synthesis of αβ-Unsaturated Aldehydes," J. Chem. Soc., Perkin Trans., 1, pp. 37-41 (1974).

Elliot Berman et al., "Photochromic Spiropyrans. I. The Effect of Substituents on the Rate of Ring Closure," J. Am. Chem. Soc., 81, 5605-5608 (1959).

Sheng-Hua Liu et al., "Synthesis of Negative Photochromic Crowned Spirobenzopyrans," Syn. Commun., 30, 5, 895-902 (2000).

Yu M. Chunaev et al., "Reaction of the Fischer Base With Nitro- and Bromo-Substituted αHydroxycinnamaldehydes," Chem. Heterocycl. Compd., 628-631 (1984).

Kentaro Morimitsu et al., "Thermal Cycloreversion Reaction of a Photochromic Dithienylperfluorocyclopentene with *tert*-Butoxy Substituents at the Reactive Carbons," The Chemical Society of Japan, 2002, p. 572-573.

* cited by examiner

INKLESS REIMAGEABLE PRINTING PAPER AND METHOD

CROSS-REFERENCE TO RELATED APPLICATIONS

Disclosed in commonly assigned U.S. patent application Ser. No. 11/123,163, filed May 6, 2005, is an image forming medium, comprising a polymer, a photochromic compound containing chelating groups embedded in the polymer, and a metal salt, wherein molecules of the photochromic compound are chelated by a metal ion from the metal salt.

Disclosed in commonly assigned U.S. patent application Ser. No. 10/835,518, filed Apr. 29, 2004, is an image forming method comprising: (a) providing a reimageable medium comprised of a substrate and a photochromic material, wherein the medium is capable of exhibiting a color contrast and an absence of the color contrast; (b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time; (c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

Disclosed in commonly assigned U.S. patent application Ser. No. 10/834,722, filed Apr. 29, 2004, is a reimageable medium comprising: a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

Disclosed in commonly assigned U.S. patent application Ser. No. 11/220,803, filed Sep. 8, 2005, is an image forming medium, comprising: a substrate; and an imaging layer comprising a photochromic material and a polymer binder coated on said substrate, wherein the photochromic material exhibits a reversible homogeneous-heterogeneous transition between a colorless state and a colored state in the polymer binder.

Disclosed in commonly assigned U.S. patent application Ser. No. 11/220,572, filed Sep. 8, 2005, is an image forming medium, comprising: a substrate; and a mixture comprising a photochromic material and a solvent wherein said mixture is coated on said substrate, wherein the photochromic material exhibits a reversible homogeneous-heterogeneous transition between a colorless state and a colored state in the solvent.

Disclosed in commonly assigned U.S. patent application Ser. No. 11/123,163, filed May 6, 2005, is an image forming medium, comprising a polymer; and a photochromic compound containing chelating groups embedded in the polymer; and a metal salt; wherein molecules of the photochromic compound are chelated by a metal ion from the metal salt.

Disclosed in commonly assigned U.S. patent application Ser. No. 11/093,993, filed Mar. 20, 2005, is a reimageable medium, comprising: a substrate having a first color; a photochromic layer adjacent to the substrate; a liquid crystal layer adjacent to the photochromic layer, wherein the liquid crystal layer includes a liquid crystal composition; and an electric field generating apparatus connected across the liquid crystal layer, wherein the electric field generating apparatus supplies a voltage across the liquid crystal layer.

Disclosed in commonly assigned U.S. patent application Ser. No. 10/834,529, filed Apr. 29, 2004, is a reimageable medium for receiving an imaging light having a predetermined wavelength scope, the medium comprising: a substrate; a photochromic material capable of reversibly converting among a number of different forms, wherein one form has an absorption spectrum that overlaps with the predetermined wavelength scope; and a light absorbing material exhibiting a light absorption band with an absorption peak, wherein the light absorption band overlaps with the absorption spectrum of the one form.

The entire disclosure of the above-mentioned applications are totally incorporated herein by reference.

TECHNICAL FIELD

This disclosure is generally directed to a substrate, method, and apparatus for inkless printing on reimageable paper. More particularly, in embodiments, this disclosure is directed to an inkless reimageable printing substrate, such as inkless printing paper utilizing a composition that is imageable by light and eraseable in a short time period by a combination of at least two of heat, light, and ultrasonic energy, where the composition exhibits a reversible transition between a colorless and a colored state. Imaging is conducted, for example, by applying UV light to cause a color change, and erasing is conducted by applying, for example, a combination of visible light and heat to the imaging material to reverse the color change. Other embodiments are directed to inkless printing methods using the inkless printing substrates, and apparatus and systems for such printing.

BACKGROUND

Inkjet printing is a well-established market and process, where images are formed by ejecting droplets of ink in an image-wise manner onto a substrate. Inkjet printers are widely used in home and business environments, and particularly in home environments due to the low cost of the inkjet printers. The inkjet printers generally allow for producing high quality images, ranging from black-and-white text to photographic images, on a ride range of substrates such as standard office paper, transparencies, and photographic paper.

However, despite the low printer costs, the cost of replacement inkjet cartridges can be high, and sometimes higher than the cost of the printer itself. These cartridges must be replaced frequently, and thus replacement costs of the ink cartridges is a primary consumer complaint relating to inkjet printing. Reducing ink cartridge replacement costs would thus be a significant enhancement to inkjet printing users.

In addition, many paper documents are promptly discarded after being read. Although paper is inexpensive, the quantity of discarded paper documents is enormous and the disposal of these discarded paper documents raises significant cost and environmental issues. Accordingly, there is a continuing desire for providing a new medium for containing the desired image, and methods for preparing and using such a medium. In aspects thereof it would be desirable to be reusable, to abate the cost and environmental issues, and desirably also is flexible and paper-like to provide a medium that is customarily acceptable to end-users and easy to use and store.

Although there are available technologies for transient image formation and storage, they generally provide less than desirable results for most applications as a paper substitute. For example, alternative technologies include liquid crystal displays, electrophoretics, and gyricon image media. However, these alternative technologies may not in a number of instances provide a document that has the appearance and feel of traditional paper, while providing the desired reimageability.

Imaging techniques employing photochromic materials, that is materials which undergo reversible or irreversible photoinduced color changes are known, for example, U.S. Pat. No. 3,961,948 discloses an imaging method based upon visible light induced changes in a photochromic imaging layer containing a dispersion of at least one photochromic material in an organic film forming binder.

These and other photochromic (or reimageable or electric) papers are desirable because they can provide imaging media that can be reused many times, to transiently store images and documents. For example, applications for photochromic based media include reimageable documents such as, for example, electronic paper documents. Reimageable documents allow information to be kept for as long as the user wants, then the information can be erased or the reimageable document can be re-imaged using an imaging system with different information.

Although the above-described approaches have provided reimageable transient documents, there is a desire for reimageable paper designs that provide longer image life-times, and more desirable paper-like appearance and feel. For example, while the known approaches for photochromic paper provide transient visible images, the visible images are very susceptible to UV, such as is present in both ambient interior light and more especially in sun light, as well as visible light. Due to the presence of this UV and visible light, the visible images are susceptible to degradation by the UV light, causing the unimaged areas to darken and thereby decrease the contrast between the desired image and the background or unimaged areas.

That is, a problem associated with transient documents is the sensitivity of the unimaged areas to ambient UV-VIS light (such as <420 nm) where the photochromic molecule absorbs. Unimaged areas become colored after a period of time, decreasing the visual quality of the document, because the contrast between white and colored state is reduced. One approach, described in the above-referenced U.S. patent application Ser. No. 10/834,529, is to stabilize the image against light of wavelength <420 nm by creating a band-pass window for the incident light capable of isomerising (i.e. inducing coloration) in the material, centered around 365 nm. However, the unimaged areas of the documents still are sensitive to UV-VIS light of wavelength centered around 365 nm.

Another problem associated with transient documents is balancing the demands of image stability to ambient conditions, and ability to quickly erase and reimage the document when desired. For example, while some materials such as alkoxy dithienylethenes show room temperature image stability for weeks and very slow light induced fading under ambient conditions, image erasure in visible light or under thermal heating is slow and occurs at too high a heating temperature. It is possible to reduce the erase time by using bulky substituents, but this kind of structural change may also increase the fading rate at ambient temperature and reduce the archival life of the image. It is important to modify the erase conditions in such a way that faster erase times are achieved while maintaining long (>2 day) image lifetime. Faster erasing time and more practical erasing conditions are important in order to make reimageable paper documents practical for commercial use.

SUMMARY

It is desirable for some uses that an image formed on a reimageable medium such as a transient document remains stable for extended time periods, without the image or image contrast being degraded by exposure to ambient UV light or having the image self-erase too quickly because of ambient thermal energy. However, it is also desired that the image can be erased in a short time period when desired, to permit reimaging of the medium. Reimageable paper documents should maintain a written image for as long as the user needs to view it, without the image being degraded by ambient light or prematurely by ambient heat. The image may then be erased or replaced with a different image by the user on command, with the erasing being conducted in a short time period.

The present disclosure addresses these and other needs, in embodiments, by providing a reimageable image forming medium utilizing a composition that is imageable by light and eraseable in a short time period by a combination of at least two of heat, light, and ultrasonic energy, where the composition exhibits a reversible transition between a colorless and a colored state. Imaging is conducted by applying, for example, UV light to the imaging material to cause a color change, and erasing is conducted by applying, for example, a combination of at least two of heat, light, and ultrasonic energy to the imaging material to reverse the color change. The present disclosure in other embodiments provides an inkless printing method using the reimageable inkless printing substrates, and apparatus and systems for such printing.

The present disclosure thereby provides a printing media, method, and printer system for printing images without using ink or toner. The paper media has a special imageable composition and it is printed with light and can be erased with at least two of heat, light, and ultrasonic energy in a short time period. The paper media thus allows image formation and erasure using a printer that does not require ink or toner replacement, and instead images the paper using a UV light source, such as a LED. The compositions and methods of the present disclosure also provide transient images that last for significantly longer periods of time, such as two days or more, before self-erase occurs. These advantages, and others, allow wider application of the reimageable transient documents.

The present disclosure describes special reimageable compositions where erasing simultaneously with at least two of heat, light, and ultrasonic energy provides faster erase than erasing with heat, light, or ultrasonic energy alone and where the erase under simultaneous erase conditions provides faster erase than the simple sum of the erase achieved using light and heat separately. This enhanced erase is unexpected.

In an embodiment, the present disclosure provides an image forming medium, comprising a substrate; and an imaging layer coated on or impregnated into said substrate, wherein the imaging layer comprises an imaging composition comprising a photochromic or photochromic-thermochromic material dissolved or dispersed in a solvent or polymeric binder;

wherein the imaging composition is imageable by light of a first wavelength and erasable in a short time period by a combination of heat and light of a second wavelength such that the simultaneous erase using a fixed amount of heat energy and light energy of the second wavelength leads to a higher degree of erase than if the fixed quantity of heat energy and light energy of the second wavelength were applied sequentially, and the image forming medium exhibits a reversible transition between a colorless and a colored state.

In another embodiment, the present disclosure provides a system for imaging the above image forming medium, the system comprising:

a printer comprising an imaging member that outputs the first wavelength and an erase component that outputs heat and the second wavelength, that is capable of heating and flooding the image forming medium with heat and light of the second wavelength simultaneously.

DETAILED DESCRIPTION OF EXEMPLARY EMBODIMENTS

Figure 1:
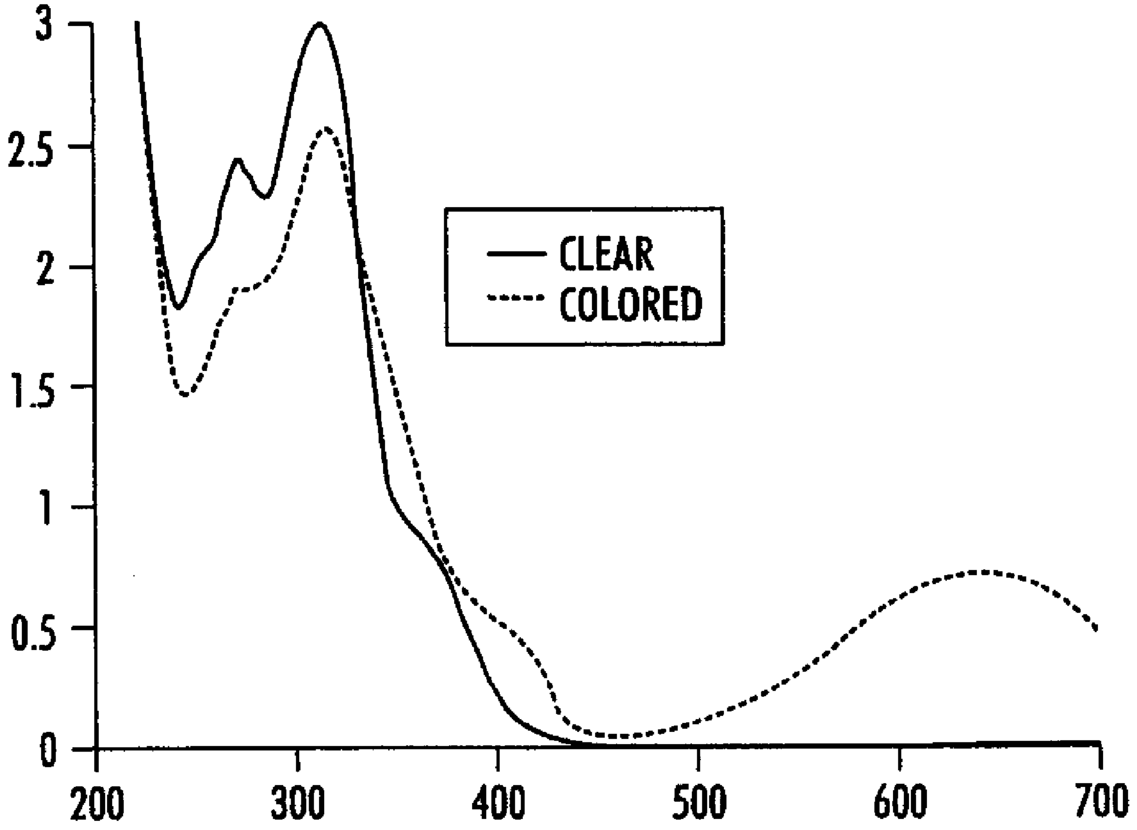
FIG. 1 shows the UV-visible spectrum absorbance for clear and colorless states of embodiments.

Generally, in various exemplary embodiments, there is provided an inkless reimageable paper or image forming medium formed using a composition that is imageable by light and eraseable in a short time period by a combination of at least two of heat, light, and ultrasonic energy, such as comprising a photochromic material dispersed in a solvent or polymeric binder, where the composition exhibits a reversible transition between a colorless and a colored state. Exposing the imaging layer to a first stimulus such as UV light irradiation causes the photochromic material to convert from the colorless state to a colored state. Likewise, exposing the imaging layer to a second stimulus such as a combination of visible light irradiation and heat causes the photochromic material to convert from the colored state to the colorless state. By a colored state, in embodiments, refers to for example, the presence or absorption of visible wavelengths; likewise, by a colorless state, in embodiments, refers to for example, the complete or substantial absence of visible wavelengths or the complete or substantial absence of absorption in the visible region of the spectrum (400-800 nanometers).

Erase of a photochromic reimageable paper can be accomplished by heat alone. However, paper is a fragile substrate and one cannot increase the thermal input to high values without damaging or wrinkling the paper substrate. Furthermore, erase of a photochromic material using heat is a typical chemical process and has an energy barrier that can be described by the Arrhenius equation. One form of the equation is $k=A*\exp[Ea/R*T]$ where Ea is the activation energy. Erase of the image can be accomplished at lower temperature or more rapidly at the same temperature by adjusting the substituents so that Ea is reduced. However this modification will necessarily also increase the rate of fading at ambient temperature, perhaps to an unacceptable rate. Although processes which use heat alone are satisfactory for their intended purposes, there is a need for dual erase methods, for example light and heat simultaneously where the degree of erase is increased for erasable paper beyond heat alone. By using dual inputs such as, for example, light and heat simultaneously, one is able to use photochromic materials for erasable media that are very stable on long-lived under ambient light and heat conditions, but erase too slowly under heat conditions alone for practical erase devices since the increased erase speed achieved with simultaneous erase with two inputs such as heat and light is significant.

Surprisingly for many photochromic materials the use of dual erase inputs simultaneously, such as at least two of heat, light, and ultrasonic energy, such as heat and light, provide an enhanced erase capability beyond the additive erase capability of each of the inputs alone.

As used herein, "short time period" refers, for example, to the erasing being conducted such that the absorbance of the imaging composition in the visible light range at the maximum absorption, such as about 640 nm, is reduced to one half of its initial value within a time period of about 10 minutes or less at a temperature of 160 degrees Celsius or less. For example, in some embodiments, the erasing can be conducted such that the absorbance of the imaging composition at about 640 nm is reduced from an absorbance of 0.7 to 0.35 within a time period of about 10 minutes or less at a temperature of 160 degrees Celsius or less, while in other embodiments the erasing can be conducted such that the absorbance of the imaging composition at about 640 nm is reduced to one half of its initial value within a time period of about 5 minutes or less than about 2 minutes or less than about 1 minute.

Photochromism and thermochromism are defined as the reversible photocoloration of a molecule from exposure to light (electromagnetic radiation) and heat (thermal radiation) based stimuli respectively. Typically photochromic molecules undergo structural and/or electronic rearrangements when irradiated with UV light that converts them to a more conjugated colored state. In the case of photochromic molecules, the colored state can typically be converted back to their original colorless state by irradiating them with visible light. In some cases thermal energy can also be used to decolorize a photochrome. Dithienylethenes and fulgides are examples of purely photochromic molecules. If the interconversion is also capable thermally (by applying heat), as is the case in alkoxy substituted dithienylethenes, spiropyrans, azabenzenes, schiff bases and the like, the molecules are classified as both thermochromic and photochromic. Photochromic compounds are completely bi-stable in absence of light whereas photochromic-thermochromic hybrid compounds will fade in the absence of light through a thermal process to the thermodynamically more stable colorless state. To create a stable reimageable document it is desired to stabilize the colored state, specifically to ambient conditions that the document will encounter in everyday life, such as broad band light and various heating/cooling conditions. However, it is also desirable that the compounds be capable of reversion back to the colorless state in a short time period, when erasing is desired.

In embodiments, the image forming medium generally comprises an imaging layer coated on or impregnated in a suitable substrate material, or sandwiched or laminated between a first and a second substrate material (i.e., a substrate material and an overcoat layer). The imaging layer comprises a photochromic or photochromic-thermochromic material dispersed in a solvent or polymeric binder. The imaging composition is imageable by light and eraseable in a short time period by a combination of at least two of heat, light, and ultrasonic energy, and exhibits a reversible transition between a colorless and a colored state.

The imaging layer can include any suitable photochromic material and solvent or polymer binder. For example, the photochromic material and solvent or polymer binder are selected such that when the photochromic material is dissolved or dispersed in the solvent or polymer binder, the photochromic material is in its clear state. However, when the photochromic material is exposed to a first stimulus, such as ultraviolet light, the photochromic material isomerizes to a more polar colored form. This color change can be reversed, and thus the image "erased" and the photochromic paper returned to a blank state. In embodiments, the erasing is conducted in a short time period by applying a second stimulus of at least two of heat, light, and ultrasonic energy, such as a combination of visible light and heat, that reverses the isomerization reaction. In the colored state, the image can remain visible for a period of two days or more, such as a week or more or a month or more, providing increased usefulness of the photochromic paper, but can be readily erased in a short time period when desired.

In embodiments, the photochromic material is a photochromic-thermochromic hybrid compound that can be imaged by UV light alone and that can be erased using a combination of visible light and heat. This erasing in the presence of visible light and heat represents a significant decrease in the erase time, as compared to erasing by visible light or heat alone. In some embodiments, the decrease in erasing time is not merely additive of the effect of the separate heat and light alone, but is greater than the sum of those effects although the additive effect is useful in itself. For example, in embodiments, it has been discovered that a strong second order effect arises between heating and simultaneous light exposure, which accelerates the erasing process. In the case of a methoxy dithienylethene, the second order effect can be an acceleration of the erasing process by a factor of 5.7 over the thermal route alone.

A method has been developed to determine the Enhancement Factor (EF). The Enhancement Factor defines the synergistic erase acceleration achieved by using dual input factors such as at least two of heat, light, and ultrasonic energy simultaneously when compared to the expected half-life achieved when using the inputs independently or sequentially.

if $t_{L2}$ is the half-life for erasure by light (or a first stimulus) alone, if $t_{H2}$ is the half-life for erasure by heat (or a second stimulus) alone, then the expected half life for additive or sequential erasure by light and heat is given by the equation $t_{exp}$ is equal to the product of $t_{L2}$ and $t_{H2}$ divided by the sum of $t_{L2}$ and $t_{H2}$. The Enhancement Factor (EF) is given by the half-life expected ($t_{exp}$) divided by half-life observed for the media or photochrome in question ($t_{obs}$). If there is no enhancement or acceleration by the simultaneous use of two inputs, for example heat and light, then EF equals 1. If there is an acceleration, then EF>1. In the event EF<1, then one of the inputs is actually inhibiting the effect of the other. In embodiments, the imaging layer of the imaging medium exhibits an enhancement factor of from about 1.05 to about 1000, such as from about 1.1 or about 1.5 to about 100, to about 250, or to about 500. In other embodiments, the imaging layer of the imaging medium exhibits an enhancement factor of from about 2 or about 3 to about 100 or to about 200, such as from about 4 or about 5 to about 100, to about 10 or to about 20.

The operation of this calculation can be illustrated by the use of a methoxydithienyl-ethene compound, which has the absorption shown in FIG. 1. The degree of erasure as an absorbance as a function of time can be read from FIG. 2. The sample was prepared by dispersing the photochromic compound PMMA as a binder. Details of sample separation are given in Example 1. The sample was heated on a hotstage at 160 deg. C (heating only); or exposed to VIS light from a Xenon light source (150 W) placed at a distance of 16.5 cm away from the sample. The sample is covered with a light filter which blocks light of wavelengths <510 nm. Simultaneous heating and VIS light exposure were done in the same set up.

Figure 2:
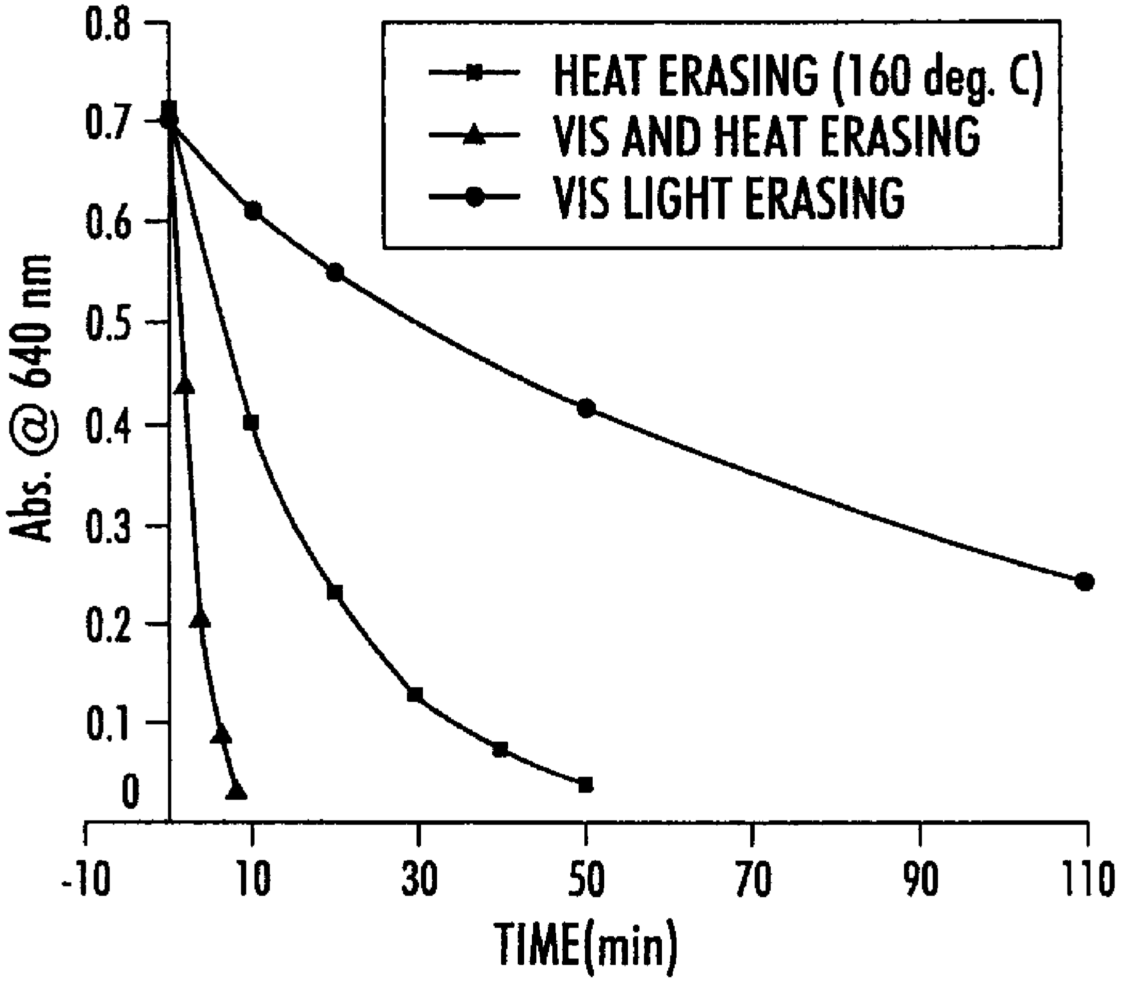
FIG. 2 shows plots of the absorption of three comparable samples according to embodiments written with UV light and erased under different conditions.

According to FIG. 2, the decrease in the absorbance for the sample heated for 5 minutes at 160 deg C was ΔAbs (Heat)=0.70-0.56=0.14. For the sample exposed for 5 minutes to Visible light, ΔAbs (Light)=0.70-0.66=0.04. If there were to be only an additive effect, one would expect that while subjecting the sample to simultaneous heat and light for the same fixed time of 5 minutes, to obtain a ΔAbs (Heat+Light; expected)=ΔAbs (Heat)+ΔAbs (Light)=0.14+0.04=0.18. However, for the sample exposed simultaneously to heat and Visible light, one measure a ΔAbs (Heat+Light)=0.70-0.13=0.57. The difference 0.57-0.18=0.39 decrease in absorption is due to the enhanced erasing due to simultaneous heating and erasing, beyond the expected additive result.

A more accurate calculation can be done by using the enhancement factor. The expected half-life for sequential erase ($t_{exp}$) can be calculated using the values read from the curve ($t_{L2}$=72.9 minutes; $t_{H2}$=11.8 minutes). Therefore $t_{exp}$=(72.9×11.8)/72.9+11.8)=10.1 minutes. The actual observed half-life under simultaneous exposure ($t_{obs}$) was 1.78 minutes, and so the Enhancement Factor for this material is EF=$t_{exp}/t_{obs}$=10.1/1.78=5.7. It is to be understood that the actual Enhancement Factors depend on the heating temperature and on the intensity of the Visible light source because the half lives for fading in various conditions are affected. For example higher heating temperatures or higher Visible light intensity will result in faster fading which may result in different enhancement factors. Nevertheless, compound having an EF>1 in a given set of fading conditions will also show an EF>1 in different conditions even if the actual EF values may be different.

Irie et al. (Dithienylethenes with a Novel Photochromic Performance", J. Org. Chem., 2002, 67, 4574-4578) described the methoxy compound from example 1 as a compound which does not fade under visible light. Accelerated erasure by simultaneous heat and strong Visible light is an unexpected finding and was not described or anticipated in Irie's publication.

Figure 3:
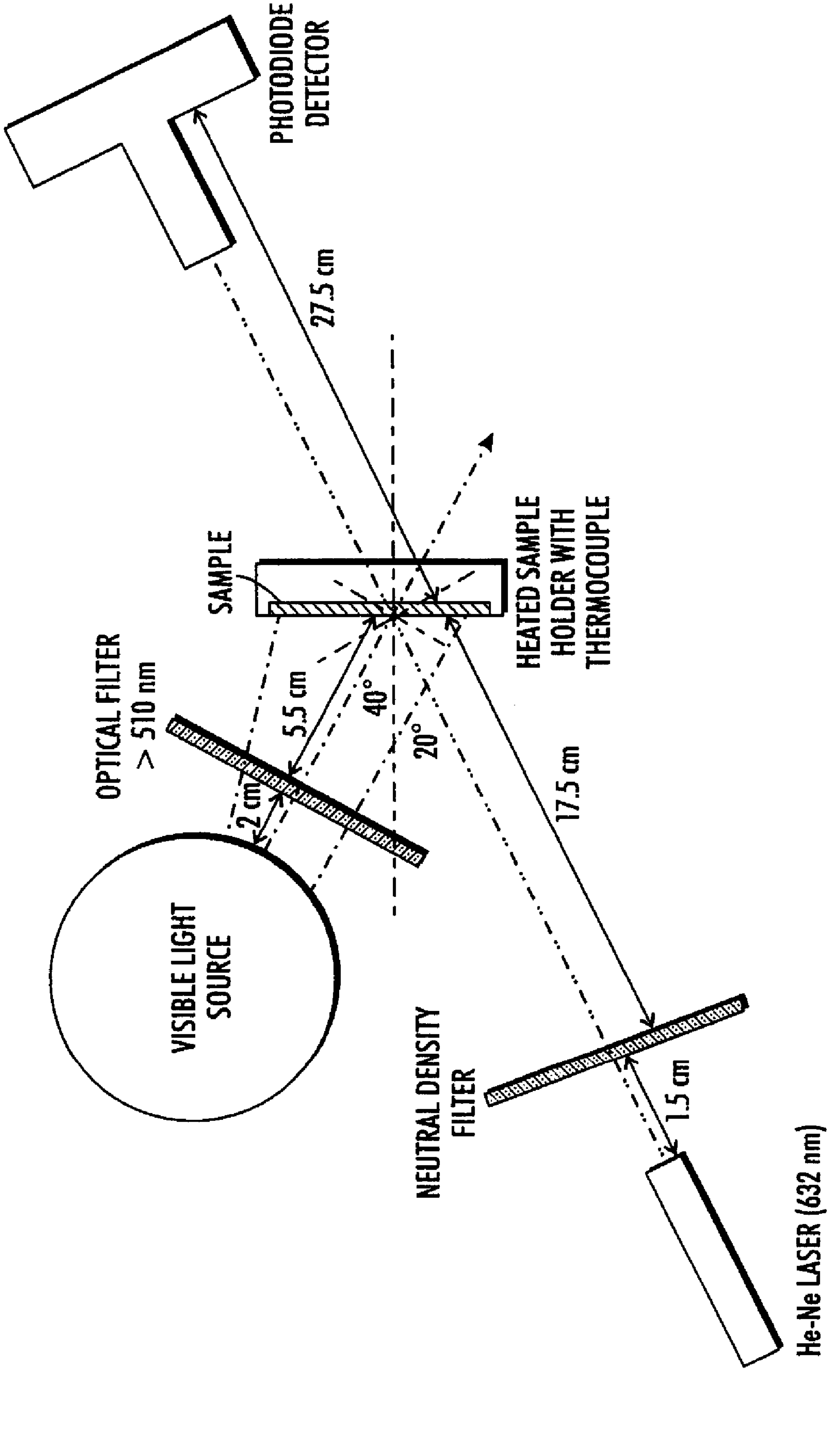
FIG. 3 shows an exemplary testing apparatus for use with the disclosure.
Figure 4A:
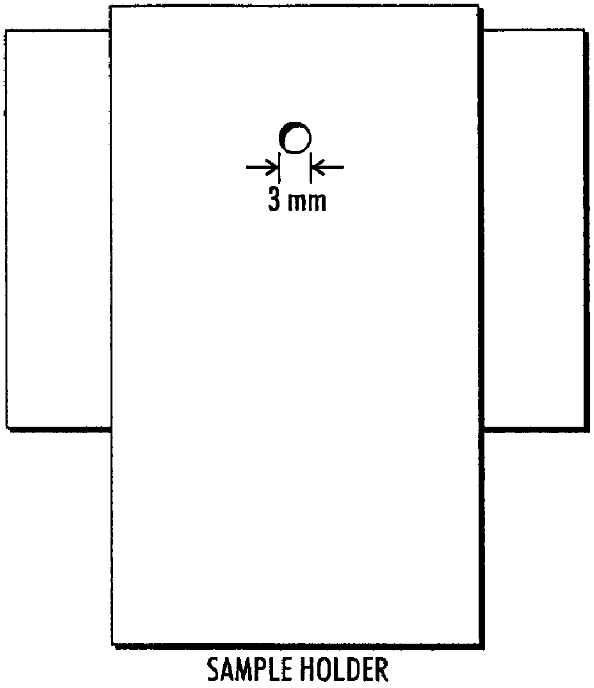
FIGS. 4A and 4B shows additional detail of the heated sample holder of the apparatus of FIG. 3.
Figure 4B:
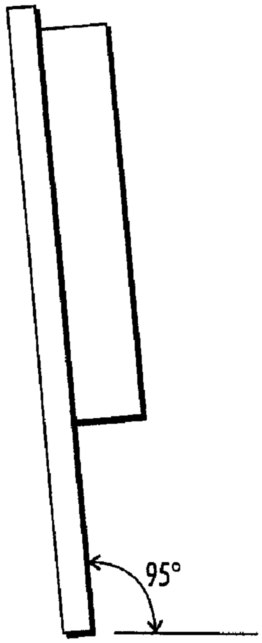

Hotplate heating is suitable for materials which fade relatively slowly like the compound from example 1. For fast fading samples (seconds or a few minutes) this becomes unsuitable because it results in too high error with respect to actual measured times. A new apparatus was built for measuring fading rates in real-time, without the need to remove the sample in order to measure the absorption at a given time. The schematic representation of the apparatus is shown in FIGS. 3 and 4A-4B. The principle of measurement is as follows. The sample is heated on a special holder at a preset temperature. The holder has a hole (3 mm in diameter) allowing light to pass through the sample. See FIGS. 4A-4B. Visible light is provided from a Xenon lamp (150 W; model LPS-220B, from Photon Technology International) placed as shown in the FIG. 3. A probe laser beam (He:Ne; 623 nm) of very low intensity is used for measuring the fading of a given sample. The intensity of the laser light is set as low as possible so that the fading produced by the laser light is minimal for the given probing time. The laser light (standard JDS uniphase Helium Neon laser 1.5 mW random polarization) is lowered by using a set of neutral density filters (one of OD=0.3 and two of OD=0.9). The transmitted signal is measured by a photodiode and the evolution of the signal is recorded by using LabView software. With the probe laser beam turned ON, at time 0, the colored sample is placed into the sample holder. Initially the transmitted signal is low, because most of it is absorbed by the colored sample. While exposing the sample to the fading conditions (heat; Visible light or both simultaneously) the sample becomes clearer because of erasing. The laser transmitted signal increases gradually. When the sample is completely erased the signal transmitted laser signal reaches a maximum and stabilizes.

The photochromic material is dispersed in a solvent or polymeric binder, where the photochromic material exhibits a reversible transition between a colorless and a colored state. The photochromic material exhibits photochromism and thermochromism, thus exhibiting a reversible transformation induced in one or both directions by absorption of an electromagnetic radiation and heat, between two forms having different absorption spectra. The first form is thermodynamically stable and may be induced by absorption of light such as ultraviolet light to convert to a second form. The reverse reaction from the second form to the first form may occur, for example, thermally and by absorption of light such as visible light. Various exemplary embodiments of the photochromic material may also encompass the reversible transformation of the chemical species among three or more forms in the event it is possible that reversible transformation occurs among more than two forms. The photochromic material of embodiments may be composed of one, two, three, four, or more different types of photochromic materials, each of which has reversibly interconvertible forms. As used herein, the term "photochromic material" refers to all molecules of a specific species of the photochromic material, regardless of their temporary isomeric forms. In various exemplary embodiments, for each type of photochromic material, one form may be colorless or weakly colored and the other form may be differently colored.

In embodiments, the reimageable paper also generally comprises a solvent or polymer binder mixture of a photochromic material dispersed or dissolved in a solvent or polymer binder, with the mixture coated on a suitable substrate material, or sandwiched between a first and a second substrate material. If desired, the mixture can be further constrained on the substrate material, or between the first and second substrate materials, such as by microencapsulating the solvent mixture, or the like.

In particular embodiments, the photochromic material is selected from any class of photochromic materials such as spiropyrans, diethienylethenes, and fulgides.

Accordingly, the substituted diarylethene suitable for use in embodiments are those that can be represented by the following general formulas:

[I]

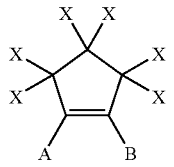

In formula [I], X independently represents H; a halogen such as chlorine, fluorine, bromine, or the like; a straight or branched, substituted or unsubstituted, alkyl group of from 1 to about 20 or to about 40 carbon atoms, such as methyl, ethyl, propyl, butyl, or the like, where the substitutions can include halogen atoms, hetero atoms (such as oxygen groups, nitrogen groups, and the like), and the like.

[II]

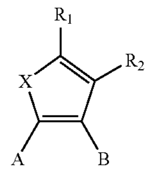

In formula [II], X represents S or O.

[III]

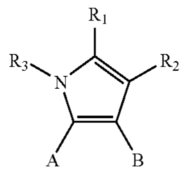

[IV]

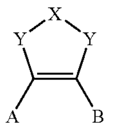

In formula [IV], X represents S, O or C═O, Y represents O, $CH_2$ or C═O.

[V]

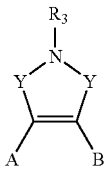

In formula [V], Y represents $CH_2$ or C═O.

[VI]

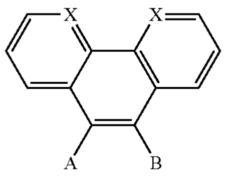

In formula [VI], X represents CH or N.

[VII]

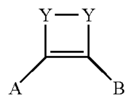

In formula [VII], Y represents $CH_2$ or C═O.

In the general formulas [I]-[VII], $R_4$, $R_5$ are each independently selected from an alkyl group, including substituted alkyl groups, unsubstituted alkyl groups, linear alkyl groups, and branched alkyl groups, and wherein hetero atoms such as oxygen, nitrogen, sulfur, silicon, phosphorus, boron, and the like either may or may not be present in the alkyl group, a halogen group, an alkoxy group, a cyano group, a nitro group, an amino group, an amide group, an aryl group, an alkylaryl group, including substituted alkylaryl groups, unsubstituted alkylaryl groups, and wherein hetero atoms either may or may not be present in the alkyl portion of the alkylaryl group or the aryl portion of the alkylaryl group, $R_6$ represents an alkyl group, including substituted alkyl groups, unsubstituted alkyl groups, linear alkyl groups, and branched alkyl groups, and wherein hetero atoms such as oxygen, nitrogen, sulfur, silicon, phosphorus, boron, and the like either may or may not be present in the alkyl group, A represents substituents [a] or [b] or [c], and B represents substituents [d] or [e] or [f] shown below,

[a]

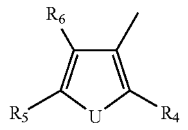

[b]

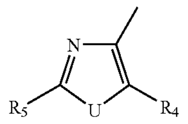

[c]

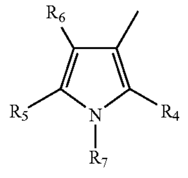

-continued

[d]

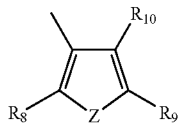

[e]

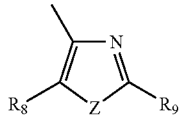

[f]

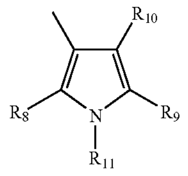

In substituents [a]-[c], $R_4$ represents an aryloxy group including phenyl, naphthyl and the like and substituted and unsubstituted heteroaromatic group, an alkoxy group or substituted alkoxy group where the alkyl portion of the alkoxy group represents a straight, branched or cyclic, substituted or unsubstituted, alkyl group of from 1 to about 20 or about 40 carbon atoms, such as methyl, ethyl, propyl, butyl, isopropyl, cyclohexyl, isoborneol or the like, where the substitutions can include halogen atoms, hetero atoms (such as oxygen groups, nitrogen groups, and the like), and the like, $R_5$ represents an aryl group, or an alkylaryl group including substituted alkylaryl groups, unsubstituted alkylaryl groups, and wherein hetero atoms either may or may not be present in the alkyl portion of the alkylaryl group or the aryl portion of the alkylaryl, a cyano group, a carboxylic acid group or an unsaturated alkene group, $R_6$ represents a hydrogen atom, an alkyl group, a halogen atom, and alkoxy group, a fluoroalkyl group, a cyano group, an aryl group, or a substituted alkylaryl group, $R_7$ represents an alkyl group and aryl group, or an alkylaryl group including substituted alkylaryl groups, unsubstituted alkylaryl groups, and wherein hetero atoms either may or may not be present in the alkyl portion of the alkylaryl group or the aryl portion of the alkylaryl and U represents O or S.

In substituents [d]-[f], $R_8$ represents an aryloxy group including phenyl, napthyl and the like, and substituted and unsubstituted heteroaromatic group, or an alkoxy group or substituted alkoxy group where the alkyl portion of the alkoxy group represents a straight, branched or cyclic, substituted or unsubstituted, alkyl group of from 1 to about 20 or about 40 carbon atoms, such as methyl, ethyl, propyl, butyl, isopropyl, cyclohexyl, isoborneol or the like, where the substitutions can include halogen atoms, hetero atoms (such as oxygen groups, nitrogen groups, and the like), and the like, $R_9$ represents an aryl group, or an alkylaryl group including substituted alkylaryl groups, unsubstituted alkylaryl groups, and wherein hetero atoms either may or may not be present in the alkyl portion of the alkylaryl group or the aryl portion of the alkylaryl, a cyano group, a carboxylic acid group or an unsaturated alkene group, $R_{10}$ represents a hydrogen atom, an alkyl group, a halogen atom, and alkoxy group, a fluoroalkyl group, a cyano group, an aryl group, or a substituted alkylaryl group, R represents an alkyl group and aryl group, or an alkylaryl group including substituted alkylaryl groups, unsubstituted alkylaryl groups, and wherein hetero atoms either may or may not be present in the alkyl portion of the alkylaryl group or the aryl portion of the alkylaryl and Z represents O or S.

In certain embodiments, the substituted diarylethenes of formulas [I]-[VII] are those compounds where $R_4$ and $R_8$ are the same alkoxy containing substituents. In this case it is necessary for the alkyl or substituted alkyl groups to contain 4 or more carbon atoms. This is a requirement for adequate thermal-based cycloreversion reaction times for the present applications. In other embodiments, however, the alkoxy substituents of $R_4$ and $R_8$ can be different alkoxy substituents. In this case as well, it is preferred that either at least one or both of the alkoxy groups contain 4 or more carbon atoms.

One example class, the alkoxy diethienylethenes are shown below, but many other classes will be evident to someone skilled in the art. The alkoxy substituted dithienylethene suitable for use in embodiments are those that can be represented by the following reversible transition:

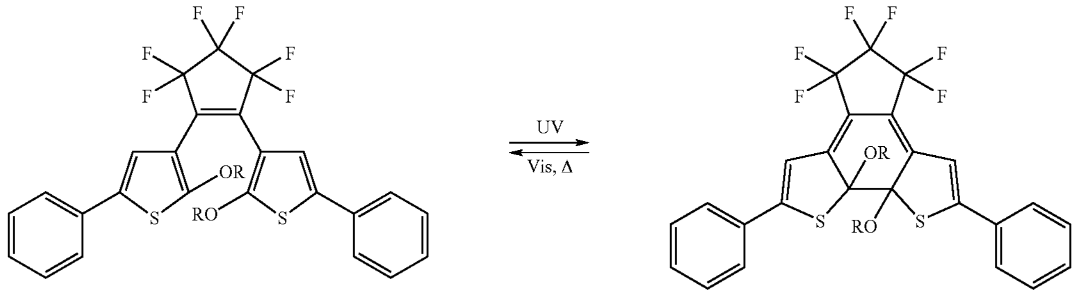

where each R, which can be the same or different, represents a straight or branched alkyl group such as methyl, ethyl, propyl, i-propyl, butyl, and the like, or cyclic alkyl group such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, where for each of the foregoing, the alkyl group has from 1 to about 20, such as from 1 to about 15, 1 to about 10, or 1 to about 6 or to about 8, carbon atoms. Each R independently can also be aryl, including phenyl, naphthyl, phenanthrene, anthracene, substituted groups thereof, and the like, and having from about 6 to about 30 carbon atoms such as from about 6 to about 20 carbon atoms; arylalkyl; such as having from about 7 to about 50 carbon atoms such as from about 7 to about 30 carbon atoms; silyl groups; nitro groups; cyano groups; halide atoms, such as fluoride, chloride, bromide, iodide, and astatide; amine groups, including primary, secondary, and tertiary amines; hydroxy groups; alkoxy groups, such as having from 1 to about 50 carbon atoms such as from 1 to about 30 carbon atoms; aryloxy groups, such as having from about 6 to about 30 carbon atoms such as from about 6 to about 20 carbon atoms; alkylthio groups, such as having from 1 to about 50 carbon atoms such as from 1 to about 30 carbon atoms; arylthio groups, such as having from about 6 to about 30 carbon atoms such as from about 6 to about 20 carbon atoms; aldehyde groups; ketone groups; ester groups; amide groups; carboxylic acid groups; sulfonic acid groups; and the like. The group can be unsubstituted or substituted, for example, by silyl groups; nitro groups; cyano groups; halide atoms, such as fluoride, chloride, bromide, iodide, and astatide; amine groups, including primary, secondary, and tertiary amines; hydroxy groups; alkoxy groups, such as having from 1 to about 20 carbon atoms such as from 1 to about 10 carbon atoms; aryloxy groups, such as having from about 6 to about 20 carbon atoms such as from about 6 to about 10 carbon atoms; alkylthio groups, such as having from 1 to about 20 carbon atoms such as from 1 to about 10 carbon atoms; arylthio groups, such as having from about 6 to about 20 carbon atoms such as from about 6 to about 10 carbon atoms; aldehyde groups; ketone groups; ester groups; amide groups; carboxylic acid groups; sulfonic acid groups; and the like. Specific examples of such compounds include those where R is methyl, ethyl, i-propyl, or cyclohexyl groups.

The alkoxy substituted dithienylethenes are more stable in their colored states than other substituted dithienylethenes, such as alkyl substituted dithienylethenes, to ambient visible light for longer periods of time. At the same time, the alkoxy substitution lowers the barrier to thermal de-colorization, or the reverse isomerization from the colored state back to the colorless state.

A particular advantage of the alkoxy modified dithienylethenes is that suitable selection of the alkoxy substituent can allow for specific tuning of the barrier to thermal erase. For example, thermal fading curves for different alkoxy modified dithienylethenes show, for example, that the barrier to thermal erasing can be tuned to be rapid and complete at elevated temperatures (such as about 100 to about 160° C.) while maintaining long-term thermal-based color stability at ambient temperatures (such as about 25 to about 70° C.) based on the structure of the alkoxy R-group substituent. Based on such thermal analysis, the half-life thermal stability of the specific compounds can be predicted to range from 2.2 years at 30° C. for the least thermally stable tert-butyl compound (see Chem. Lett. 2002, 572.), to 420 years at 30° C. for the methoxy compound.

Accordingly, in embodiments, the photochromic material can be readily converted from its colored state to its colorless state by exposure to suitable irradiation, such as a combination of visible light and heat, or at least two of heat, light, and ultrasonic energy. By "readily converted" herein is meant that the photochromic material can be converted from its colored state to its colorless state in a short time period, as described above. In contrast, the photochromic material is not readily converted from its colored state to its colorless state in a short time period, that is, the absorbance of the imaging composition in the visible light range, such as about 640 nm, is not reduced from its initial absorbance to one half its value within a time period of about 10 minutes or less, upon exposure heat or visible light alone.

The heat used in activating the conversion can be any suitable heating temperature, for example from about 80 to about 250° C., such as from about 100 to about 200° C. or about 100 to about 160° C. The heating can be provided by any suitable means, such as hot plate, radiant heater, convection heater, or the like. Similarly, the light used in activating the conversion can be any suitable light wavelength, for example from visible to ultraviolet, where visible light is used in embodiments. The lighting can be provided by any suitable means, and can be of a narrow wavelength range or broad wavelength range. In an embodiment, a light source that provides both visible light wavelengths and infrared wavelength to provide heat can be used, while in other embodiments the light can be appropriately shielded so as not to provide any additional thermal radiation. Other erasing stimuli can also be used, such as ultrasonic energy.

These photochromic materials are thus different from other photochromic materials including other differently substituted or unsubstituted ditheinyethenes, in that the materials are generally not convertible back from the colored state to the colorless state in a short time period by exposure to visible light alone, but require exposure to appropriate heating, with or without visible light in order to convert back from the colored state to the colorless state in a short time period. This allows for a desirable product because the colored state can be frozen until sufficient heat beyond that of ambient heat induces enough lattice mobility to allow the structural reorganization to occur. In addition, in embodiments, the photochromic material requires only the application of heat and not light stimulus, to cause the photochromic-thermochromic material to switch between the colored and colorless states.

In one embodiment, the image forming material (photochromic material) is dissolved or dispersed in any suitable carrier, such as a solvent, a polymer binder, or the like. Suitable solvents include, for example, straight chain aliphatic hydrocarbons, branched chain aliphatic hydrocarbons, and the like, such as where the straight or branched chain aliphatic hydrocarbons have from about 1 to about 30 carbon atoms. For example, a non-polar liquid of the ISOPAR™ series (manufactured by the Exxon Corporation) may be used as the solvent. These hydrocarbon liquids are considered narrow portions of isoparaffinic hydrocarbon fractions. For example, the boiling range of ISOPAR G™ is from about 157° C. to about 176° C.; ISOPAR H™ is from about 176° C. to about 191° C.; ISOPAR K™ is from about 177° C. to about 197° C.; ISOPAR L™ is from about 188° C. to about 206° C.; ISOPAR M™ is from about 207° C. to about 254° C.; and ISOPAR V™ is from about 254.4° C. to about 329.4° C. Other suitable solvent materials include, for example, the NORPAR™ series of liquids, which are compositions of n-paraffins available from Exxon Corporation, the SOLTROL™ series of liquids available from the Phillips Petroleum Company, and the SHELLSOL™ series of liquids available from the Shell Oil Company. Mixtures of one or more solvents, i.e., a solvent system, can also be used, if desired. In addition, more polar solvents can also be used, if desired. Examples of more polar solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate, dimethylformamide, cyclohexanone, N-methyl acetamide and the like. In addition, more polar solvents can also be used, examples of more polar solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate, dimethylformamide, cyclohexanone, N-methyl acetamide and the like. The solvent may be composed of one, two, three or more different solvents. When two or more different solvents are present, each solvent may be present in an equal or unequal amount by weight ranging for example from about 5% to 90%, particularly from about 30% to about 50%, based on the weight of all solvents.

Both compositions dispersable in either organic polymers or waterborne polymers can be used, depending on the used components. For example, for waterborne compositions, polyvinylalcohol is a suitable application solvent, and polymethylmethacrylate is suitable for organic soluble compositions.

Suitable examples of polymer binders include, but are not limited to, polyalkylacrylates like polymethyl methacrylate (PMMA), polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, and the like. Copolymer materials such as polystyrene-acrylonitrile, polyethylene-acrylate, vinylidenechloride-vinylchloride, vinylacetate-vinylidene chloride, styrene-alkyd resins are also examples of suitable binder materials. The copolymers may be block, random, or alternating copolymers. In some embodiments, polymethyl methacrylate or a polystyrene is the polymer binder, in terms of their cost and wide availability. The polymer binder, when used, has the role to provide a coating or film forming composition.

Phase change materials can also be used as the polymer binder. Phase change materials are known in the art, and include for example crystalline polyethylenes such as Polywax® 2000, Polywax® 1000, Polywax® 500, and the like from Baker Petrolite, Inc.; oxidized wax such as X-2073 and Mekon wax, from Baker-Hughes Inc.; crystalline polyethylene copolymers such as ethylene/vinyl acetate copolymers, ethylene/vinyl alcohol copolymers, ethylene/acrylic acid copolymers, ethylene/methacrylic acid copolymers, ethylene/carbon monoxide copolymers, polyethylene-b-polyalkylene glycol wherein the alkylene portion can be ethylene, propylene, butylenes, pentylene or the like, and including the polyethylene-b-(polyethylene glycol)s and the like; crystalline polyamides; polyester amides; polyvinyl butyral; polyacrylonitrile; polyvinyl chloride; polyvinyl alcohol hydrolyzed; polyacetal; crystalline poly(ethylene glycol); poly(ethylene oxide); poly(ethylene therephthalate); poly(ethylene succinate); crystalline cellulose polymers; fatty alcohols; ethoxylated fatty alcohols; and the like, and mixtures thereof.

In general, most any organic polymer can be used. However, in embodiments, because heat is used to erase the visible image, the polymer can be selected such that it has thermal properties that can withstand the elevated temperatures that may be used for erasing formed images based on the specific photochromic material that is chosen.

In embodiments, the imaging composition can be applied in one form, and dried to another form for use. Thus, for example, the imaging composition comprising photochromic material and solvent or polymer binder may be dissolved or dispersed in a solvent for application to or impregnation into a substrate, with the solvent being subsequently evaporated to form a dry layer.

In general, the imaging composition can include the carrier and imaging material in any suitable amounts, such as from about 5 to about 99.5 percent by weight carrier, such as from about 30 to about 70 percent by weight carrier, and from about 0.05 to about 50 percent by weight photochromic material, such as from about 0.1 to about 5 percent photochromic material by weight.

For applying the imaging layer to the image forming medium substrate, the image forming layer composition can be applied in any suitable manner. For example, the image forming layer composition can be mixed and applied with any suitable solvent or polymer binder, and subsequently hardened or dried to form a desired layer. Further, the image forming layer composition can be applied either as a separate distinct layer to the supporting substrate, or it can be applied so as to impregnate into the supporting substrate.

The image forming medium may comprise a supporting substrate, coated or impregnated on at least one side with the imaging layer. As desired, the substrate can be coated or impregnated on either only one side, or on both sides, with the imaging layer. When the imaging layer is coated or impregnated on both sides, or when higher visibility of the image is desired, an opaque layer may be included between the supporting substrate and the imaging layer(s) or on the opposite side of the supporting substrate from the coated imaging layer. Thus, for example, if a one-sided image forming medium is desired, the image forming medium may include a supporting substrate, coated or impregnated on one side with the imaging layer and coated on the other side with an opaque layer such as, for example, a white layer. Also, the image forming medium may include a supporting substrate, coated or impregnated on one side with the imaging layer and with an opaque layer between the substrate and the imaging layer. If a two-sided image forming medium is desired, then the image forming medium may include a supporting substrate, coated or impregnated on both sides with the imaging layer, and with at least one opaque layer interposed between the two coated imaging layers. Of course, an opaque supporting substrate, such as conventional paper, may be used in place of a separate supporting substrate and opaque layer, if desired.

Any suitable supporting substrate may be used. For example, suitable examples of supporting substrates include, but are not limited to, glass, ceramics, wood, plastics, paper, fabrics, textile products, polymeric films, inorganic substrates such as metals, and the like. The plastic may be for example a plastic film, such as polyethylene film, polyethylene terephthalate, polyethylene naphthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.3 mm to about 5 mm, although smaller or greater thicknesses can be used, if desired.

When an opaque layer is used in the image forming medium, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.01 mm to about 10 mm, such as about 0.1 mm to about 5 mm, although other thicknesses can be used.

If desired, a further overcoating layer may also be applied over the applied imaging layer. The further overcoating layer may, for example, be applied to further adhere the underlying layer in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.01 mm to about 10 mm, such as about 0.1 mm to about 5 mm, although other thicknesses can be used. For example, if desired or necessary, the coated substrate can be laminated between supporting sheets such as plastic sheets.

In embodiments where the imaging material is coated on or impregnated into the substrate, the coating can be conducted by any suitable method available in the art, and the coating method is not particularly limited. For example, the imaging material can be coated on or impregnated into the substrate by dip coating the substrate into a solution of the imaging material composition followed by any necessary drying, or the substrate can be coated with the imaging composition to form a layer thereof. Similarly, the protective coating can be applied by similar methods.

Where the photochromic material is mixed with a solvent applied on the substrate, and where the solvent system is retained in the final product, additional processing may be required. As a result, where the photochromic material is simply coated on the substrate, a cover material is generally applied over the solvent system to constrain the solvent system in place on the substrate. Thus, for example, the cover material can be a solid layer, such as any of the suitable materials disclosed above for the substrate layer. In an alternative embodiment, a polymer material or film may be applied over the photochromic material, where the polymer film penetrates the photochromic material at discrete points to in essence form pockets or cells of photochromic material that are bounded on the bottom by the substrate and on the sides and top by the polymeric material. The height of the cells can be, for example, from about 1 micron to about 1000 microns, although not limited thereto. The cells can be any shape, for example square, rectangle, circle, polygon, or the like. In these embodiments, the cover material is advantageously transparent and colorless, to provide the full color contrast effect provided by the photochromic material.

In another embodiment, the solvent system with the photochromic material can be encapsulated or microencapsulated, and the resultant capsules or microcapsules deposited or coated on the substrate as described above. Any suitable encapsulation technique can be used, such as simple and complex coacervation, interfacial polymerization, in situ polymerization, phase separation processes. For example, a suitable method if described for ink materials in U.S. Pat. No. 6,067,185, the entire disclosure of which is incorporated herein by reference and can be readily adapted to the present disclosure. Useful exemplary materials for simple coacervation include gelatin, polyvinyl alcohol, polyvinyl acetate and cellulose derivatives. Exemplary materials for complex coacervation include gelatin, acacia, acrageenan, carboxymethylecellulose, agar, alginate, casein, albumin, methyl vinyl ether-co-maleic anhydride. Exemplary useful materials for interfacial polymerization include diacyl chlorides such as sebacoyl, adipoyl, and di or poly-amines or alcohols and isocyanates. Exemplary useful materials for in situ polymerization include for example polyhydroxyamides, with aldehydes, melamine or urea and formaldehyde; water-soluble oligomers of the condensate of melamine or urea and formaldehyde, and vinyl monomers such as for example styrene, methyl methacrylate and acrylonitrile. Exemplary useful materials for phase separation processes include polystyrene, polymethylmethacrylate, polyethylmethacrylate, ethyl cellulose, polyvinyl pyridine and polyacrylonitrile. In these embodiments, the encapsulating material is also transparent and colorless, to provide the full color contrast effect provided by the photochromic material.

Where the photochromic material is encapsulated, the resultant capsules can have any desired average particle size. For example, suitable results can be obtained with capsules having an average size of from about 2 to about 1000 microns, such as from about 10 to about 600 or to about 800 microns, or from about 20 to about 100 microns, where the average size refers to the average diameter of the microcapsules and can be readily measured by any suitable device such as an optical microscope. For example, in embodiments, the capsules are large enough to hold a suitable amount of photochromic material to provide a visible effect when in the colored form, but are not so large as to prevent desired image resolution.

In its method aspects, the present disclosure involves providing an image forming medium comprised of a substrate and an imaging layer comprising a photochromic material dispersed in a solvent or polymeric binder, wherein the imaging composition is imageable by light and eraseable in a short time period by a combination of at least two of heat, light, and ultrasonic energy, and exhibits a reversible transition between a colorless and a colored state. To provide separate writing and erasing processes, imaging is conducted by applying a first stimulus, such as UV light irradiation, to the imaging material to cause a color change, and erasing is conducted by applying a second, different stimulus, such as a combination of heat and UV or visible light irradiation, to the imaging material to reverse the color change in a short time period. Thus, for example, the imaging layer as a whole could be sensitive at a first (such as UV) wavelength that causes the photochromic material to convert from a clear to a colored state, while the imaging layer as a whole could be sensitive at a second, different (such as visible) wavelength and to heat that causes the photochromic material to convert from the colored back to the clear state in a short time period.

In embodiments, heating can be applied to the imaging layer before or at the same time as the light irradiation, for either the writing and/or erasing processes. However, in embodiments, heating is not required for the writing process, as such stimuli as UV light irradiation are sufficient to cause the color change from colorless to colored, while a combination of stimuli such as heating in combination with light is used for the erasing process to increase material mobility for speeding the color change from colored to colorless. When used, the heat raises the temperature of the imaging composition, particularly the photochromic material, to raise the mobility of the imaging composition and thus allow easier and faster conversion from one color state to the other. The heating can be applied before or during the irradiation, as long as the heating causes the imaging composition to be raised to the desired temperature during the irradiation or erasing process. Any suitable heating temperature can be used, and will depend upon, for example, the specific imaging composition used. For example, where the photochromic material is dispersed in a polymer or a phase change composition, the heating can be conducted to raise the polymer to at or near its glass transition temperature or melting point, such as within about 5° C., within about 10° C., or within about 20° C. of the glass transition temperature or melting point, although it is desired in certain embodiments that the temperature not exceed the glass transition temperature or melting point of the polymer binder so as to avoid undesired movement or flow of the polymer on the substrate. Of course, the heating need not raise the temperature this high, as long as lower temperatures provide the desired stimulus for color change. In other embodiments, for example where the photochromic material is dispersed in a solvent, the heating can be conducted to raise the solvent to at or near its boiling point, such as within about 5° C., within about 10° C., or within about 20° C. of the boiling point, although it is desired in certain embodiments that the temperature not exceed the boiling point so as to avoid loss or vaporization of solvent.

The different stimuli, such as different light irradiation wavelengths, can be suitably selected to provide distinct writing and erasing operations. For example, in one embodiment, the photochromic material is selected to be sensitive to UV light to cause isomerization from the clear state to the colored state, but to be sensitive to visible light and heat to cause isomerization from the colored state to the clear state. In other embodiments, the writing and erasing wavelengths are separated by at least about 10 nm, such as at least about 20 nm, at least about 30 nm, at least about 40 nm, at least about 50 nm, or at least about 100 nm. Thus, for example, if the writing wavelength is at a wavelength of about 360 nm, then the erasing wavelength is desirably a wavelength of greater than 400 nm or greater than about 500 nm. Of course, the relative separation of sensitization wavelengths can be dependent upon, for example, the relatively narrow wavelengths of the exposing apparatus. Of course since reading requires an absorption in the visible region for a color image most erase exposures are conducted in the visible region 400-800 nm, well away from the ultraviolet writing wavelength region (<400 nm).

In a writing process, the image forming medium is exposed to an imaging light having an appropriate activating wavelength, such as a UV light source such as a light emitting diode (LED), in an imagewise fashion. The imaging light supplies sufficient energy to the photochromic material to cause the photochromic material to convert, such as isomerize, from a clear state to a colored state to produce a colored image at the imaging location, and for the photochromic material to isomerize to stable isomer forms to lock in the image. The amount of energy irradiated on a particular location of the image forming medium can affect the intensity or shade of color generated at that location. Thus, for example, a weaker intensity image can be formed by delivering a lesser amount of energy at the location and thus generating a lesser amount of colored photochromic unit, while a stronger intensity image can be formed by delivering a greater amount of energy to the location and thus generating a greater amount of colored photochromic unit. When suitable photochromic material, solvent or polymer binder, and irradiation conditions are selected, the variation in the amount of energy irradiated at a particular location of the image forming medium can thus allow for formation of grayscale images, while selection of other suitable photochromic materials can allow for formation of full color images.

Once an image is formed by the writing process, the formation of stable isomer forms of the photochromic material within the imaging materials locks in the image. That is, the isomer forms of the selected photochromic materials are more stable to ambient heat and light, and thus exhibit greater long-term stability. The image is thereby "frozen" or locked in, and cannot be readily erased in the absence of a specific second stimuli such as heat and light, particularly in a short time period. In embodiments, the image is locked in, and cannot be readily erased by ambient heat or light alone, and requires elevated temperature and light in order to revert back to the colorless state. The imaging substrate thus provides a reimageable substrate that exhibits a long-lived image lifetime, but which can be erased as desired and reused for additional imaging cycles.

In an erasing process, the writing process is essentially repeated, except that a different stimuli, such as a different wavelength irradiation light, such as visible light, is used in combination with the photochromic material being heated such as to a temperature at or near a glass transition, melting, or boiling point temperature of the carrier material. For example, the heating can be conducted at a temperature of from about 80 to about 250° C., such as from about 100 to about 200° C. or about 100 to about 160° C. The erasing process causes the isomerizations to reverse and the photochromic unit to convert, such as isomerize, from a colored state to a clear state to erase the previously formed image at the imaging location in a short time period. The erasing procedure can be on an image-wise fashion or on the entire imaging layer as a whole, as desired.

The separate imaging lights used to form the transient image and erase the transient image may have any suitable predetermined wavelength scope such as, for example, a single wavelength or a band of wavelengths. In various exemplary embodiments, the imaging lights are an ultraviolet (UV) light and a visible light each having a single wavelength or a narrow band of wavelengths. For example, the UV light can be selected from the UV light wavelength range of about 200 nm to about 475 nm, such as a single wavelength at about 365 nm or a wavelength band of from about 360 nm to about 370 nm. For forming the image, as well as for erasing the image, the image forming medium may be exposed to the respective imaging or erasing light for a time period ranging from about 10 milliseconds to about 5 minutes, particularly from about 30 milliseconds to about 1 minute. The imaging light may have an intensity ranging from about 0.1 $mW/cm^2$ to about 100 $mW/cm^2$, particularly from about 0.5 $mW/cm^2$ to about 10 $mW/cm^2$.

The erasing light is strong visible light of a wavelength which overlaps with the absorption spectrum of the colored state isomer in the visible region. For example the erasing useful light may have a wavelength ranging from about 400 nm to about 800 nm or more preferably form about 500 nm to about 800 nm. The usable Visible light of the erasing may be obtained form a Xenon light source with a bulb having a power from 5 W to about 1000 W or more preferably from about 20 W to about 200 W, which is placed in the proximity of the areas of the document which is to be erased. Another suitable erasing light source is an LED having a wavelength in the visible region of the light spectrum, as defined above. The erasing light may be having a single wavelength or a narrow band of wavelengths.

In various exemplary embodiments, imaging light corresponding to the predetermined image may be generated for example by a computer or a Light Emitting Diode (LED) array screen and the image is formed on the image forming medium by placing the medium on or in proximity to the LED screen for the desired period of time. In other exemplary embodiments, a UV Raster Output Scanner (ROS) may be used to generate the UV light in an image-wise pattern. This embodiment is particularly applicable, for example, to a printer device that can be driven by a computer to generate printed images in an otherwise conventional fashion. That is, the printer can generally correspond to a conventional inkjet printer, except that the inkjet printhead that ejects drops of ink in the imagewise fashion can be replaced by a suitable UV light printhead that exposes the image forming medium in an imagewise fashion. In this embodiment, the replacement of ink cartridges is rendered obsolete, as writing is conducted using a UV light source. The printer can also include a heating device, which can be used to apply heat to the imaging material to erase any existing images. Other suitable imaging techniques that can be used include, but are not limited to, irradiating a UV light onto the image forming medium through a mask, irradiating a pinpoint UV light source onto the image forming medium in an imagewise manner such as by use of a light pen, and the like.

For erasing an image in order to reuse the imaging substrate, in various exemplary embodiments, the substrate can be exposed to a suitable imaging light and heat, to cause the image to be erased. Such erasure can be conducted in any suitable manner, such as by exposing the entire substrate to the erasing light and heat at once, exposing the entire substrate to the erasing light and heat in a successive manner such as by scanning the substrate, or the like. In other embodiments, erasing can be conducted at particular points on the substrate, such as by using a light pen and focused heat source, or the like.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast" may encompass any degree of color contrast sufficient to render an image discernable to a user regardless of whether the color contrast changes or is constant during the visible time.

An example is set forth hereinbelow and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

A photochromic material, a methoxy substituted dithienylethene, was synthesized according to the procedure described in "Dithienylethenes with a Novel Photochromic Performance", J. Org. Chem., 2002, 67, 4574-4578.

A solution was made by dissolving 140 mg of the photochromic material in 5 ml of a solution of polymethylmethacrylate (PMMA, polymeric binder) dissolved in toluene (PMMA/Toluene=20 g/100 ml). The solution is then spin-coated onto quartz slides (1000 rpm; 60 seconds). The coated slides were allowed to dry, to provide a reimageable media, ready for printing.

The UV/visible spectra of the test samples were first measured in the clear state. Subsequently, the films were illuminated with a UV light source (365 nm UV light, high intensity for 30 seconds) to produce the colored state. The UV/visible spectra of the clear and colored states on the quartz substrate are shown in FIG. 1. Initially after the UV illumination, all of the samples had an absorbance of about 0.7 at 640 nm (blue, written state).

The erasing (fading) kinetics were followed by measuring the decrease of the absorption at $\lambda_{max}$=640 nm. A set-up using a filtered Xenon lamp light source (150 W) placed at 16.5 cm away from the hotplate surface (VIS light of a wavelengths >510 nm) was used, which provides reproducible erasing kinetics. Identical samples prepared as described above were erased under three different conditions:

(a) Heating at 160° C. as described by "Dithienylethenes with a Novel Photochromic Performance", J. Org. Chem., 2002, 67, 4574-4578.

(b) Simultaneous heating at 160° C. and exposing to VIS light. (>510 nm) (note the sample is shielded from additional heating due to the light source).

(c) Visible light only (>510 nm) at room temperature.

The results are shown in FIG. 2.

Referring to the results of FIG. 2, it can be seen that erasing with an intense visible light only is a very slow process, not erasing the sample even after 110 minutes. Heating at 160° C. erases this sample in about 50 minutes. However, a combination of the two provides a further acceleration of a factor of 6, resulting in erasing the sample in less than 10 minutes.

Example 2

Several photochromic compounds were tested with the set-up from FIG. 3, in order to obtain real-time erasing rates data. This illustrates the use of this set-up which is particularly useful for fast fading samples. The glass-coated samples were prepared in the same way as for the photochromic compound from Example 1. The samples were erased in three different conditions: heat (140-145 deg. C); Visible light (as described in FIG. 3) and simultaneous heat and light. The results are shown in the table below. Time is expressed in seconds.

| Compound | Heat | Light | Heat + Light ($t_{obs}$) | $t_{exp}$ | EF |
|---|---|---|---|---|---|
| 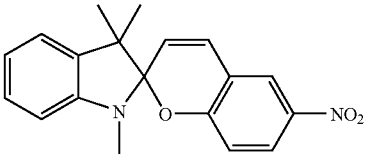 | 5.7 | 46 | 4.4 | 4.8 | 1.1 |
| 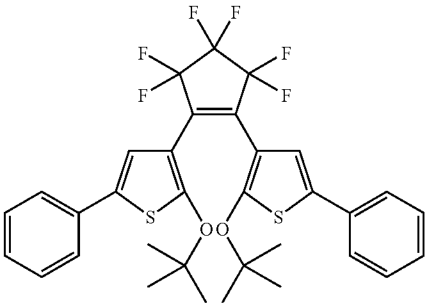 | 16 | 47 | 12 | 12 | 1.0 |
| 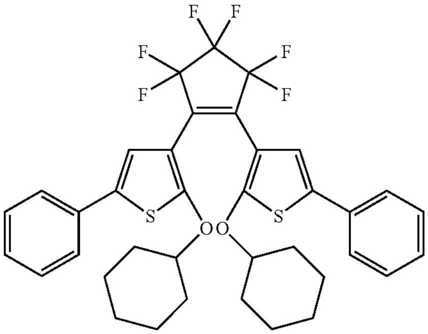 | 360 | 834 | 192 | 251 | 1.3 |

-continued

| Compound | Heat | Light | Heat + Light ($t_{obs}$) | $t_{exp}$ | EF |
|---|---|---|---|---|---|
| 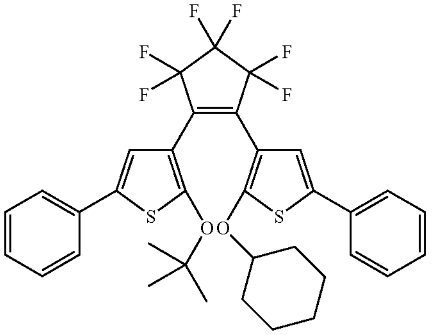 | 59 | 175 | 30 | 44 | 1.5 |

The table illustrate the fact that EF<1 is not an inherent property of any photochromic material. For example, entry #2 in the table provided an EF=1, which means that no accelerating effect is observed. On the other hand the table illustrates the fact that EF>1 is not a property specific to dithienylethene. Entry #1 in the table is a member of a different class of compounds, a spiropyran.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An image forming medium, comprising a substrate; and an imaging layer coated on or impregnated into said substrate, wherein the imaging layer comprises an imaging composition comprising a photochromic or photochromic-thermochromic material dissolved or dispersed in a solvent or polymeric binder;

wherein the photochromic or photothermochromic material is selected so that:

the imaging composition is imageable by light of a first wavelength and erasable in a short time period by a combination of heat and light of a second wavelength such that the simultaneous erase using a fixed amount of heat energy and light energy of the second wavelength leads to a higher degree of erase than if the fixed quantity of heat energy and light energy of the second wavelength were applied sequentially;

wherein the short time period is the time period for the maximum absorbance of the imaging composition in the region 400-800 nm to be reduced from its initial absorbance to one half of the initial absorbance, in about 10 minutes or less;

the image forming medium exhibits a reversible transition between a colorless and a colored state; and the imaging composition exhibits an erase enhancement factor (EF) of greater than 1, wherein:

EF is equal to a half-life expected ($t_{exp}$) divided by a half-life observed ($t_{obs}$), $t_{exp}$ is equal to the product of $t_{L2}$ and $t_{H2}$ divided by the sum of $T_{L2}$ and $t_{H2}$, $t_{L2}$ is a half-life for erasure by light alone, and $t_{H2}$ is a half-life for erasure by heat alone.

2. The image forming medium in claim 1, wherein the photochromic or photothermochromic material is selected so that the image is readable for more than two days after imaging and storage and ambient temperature and under ambient light conditions.

3. The image forming medium of claim 1, wherein the heat is a temperature of from about 80 to about 250° C.

4. The image forming medium of claim 1, wherein the photochromic material is selected from the group consisting of spiropyrans, diethienylethenes, and fulgides, and mixtures thereof.

5. The image forming medium of claim 1, wherein the photochromic material is an alkoxy substituted dithienylethene represented by the formula:

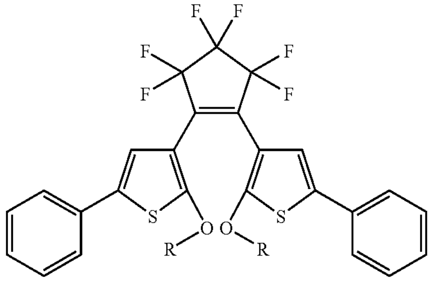

wherein each R, which can be the same or different represents an unsubstituted or substituted, straight, branched, or cyclic, alkyl group having from 1 to about 20 carbon atoms, an unsubstituted or substituted aryl group having from about 6 to about 30 carbon atoms, an unsubstituted or substituted arylalkyl group having from about 7 to about 50 carbon atoms, silyl groups, nitro groups, cyano groups, halide atoms, amine groups, hydroxy groups, alkoxy groups having from 1 to about 50 carbon atoms, aryloxy groups having from about 6 to about 30 carbon atoms, alkylthio groups having from 1 to about 50 carbon atoms, arylthio groups having from about 6 to about 30 carbon atoms, aldehyde groups, ketone groups, ester groups, amide groups, carboxylic acid groups, and sulfonic acid groups.

6. The image forming medium of claim 5, wherein the alkyl group is substituted by one or more groups selected from the group consisting of silyl groups, nitro groups, cyano groups, halide atoms, amine groups, hydroxy groups, alkoxy groups, aryloxy groups, alkylthio groups, arylthio groups, aldehyde groups, ketone groups, ester groups, amide groups, carboxylic acid groups, and sulfonic acid groups.

7. The image forming medium of claim 1, wherein the photochromic material is represented by the general formula (I)

[I]

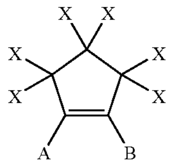

wherein:

each X independently represents hydrogen, an alkyl chain having 1 to 20 carbon atoms, bromine, chlorine or an iodine atom, A represents a group of formula (a)-(c), and B represents a group of formula (d)-(f),

[a]

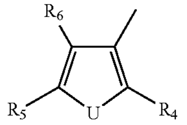

[b]

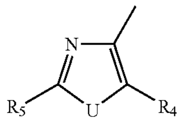

[c]

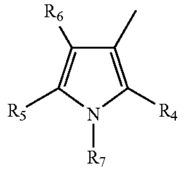

[d]

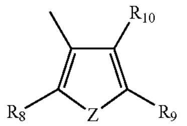

[e]

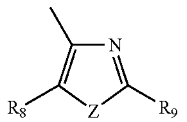

[f]

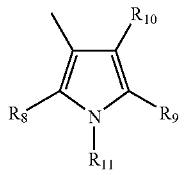

wherein:

$R_4$ represents an aryloxy group, a substituted and unsubstituted heteroaromatic group, an alkoxy group, or a substituted alkoxy group, where the alkyl portion of the alkoxy group represents a straight, branched or cyclic, substituted or unsubstituted, alkyl group of from 1 to about 40 carbon atoms, $R_5$ represents an aryl group, a substituted or unsubstituted alkylaryl group wherein hetero atoms either may or may not be present in the alkyl portion of the alkylaryl group or the aryl portion of the alkylaryl group, a cyano group, a carboxylic acid group, or an unsaturated alkene group, $R_6$ represents a hydrogen atom, an alkyl group, a halogen atom, an alkoxy group, a fluoroalkyl group, a cyano group, an aryl group, or a substituted alkylaryl group, $R_7$ represents an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl, $R_8$ represents an aryloxy group, substituted and unsubstituted heteroaromatic group, or an alkoxy group or substituted alkoxy group where the alkyl portion of the alkoxy group represents a straight, branched or cyclic, substituted or unsubstituted, alkyl group of from 1 to about 40 carbon atoms, $R_9$ represents an aryl group, a substituted or unsubstituted alkylaryl groups wherein hetero atoms either may or may not be present in the alkyl portion of the alkylaryl group or the aryl portion of the alkylaryl group, a cyano group, a carboxylic acid group, or an unsaturated alkene group, $R_{10}$ represents a hydrogen atom, an alkyl group, a halogen atom, an alkoxy group, a fluoroalkyl group, a cyano group, an aryl group, or a substituted alkylaryl group, $R_{11}$ represents an alkyl group, an aryl group, or a substituted or unsubstituted alkylaryl group wherein hetero atoms either may or may not be present in the alkyl portion of the alkylaryl group or the aryl portion of the alkylaryl, and U and Z each independently represent sulfur or oxygen atoms.

8. The image forming medium of claim 1, wherein the photochromic material is represented by the general formulae formulae (II), (III), (IV), (V), (VI), (VII)

[II]

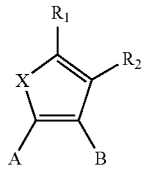

[III]

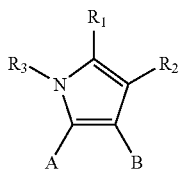

[IV]

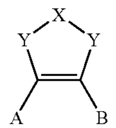

-continued

[V]

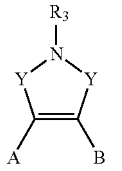

[VI]

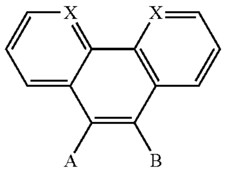

[VIII]

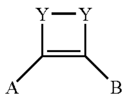

wherein:

in formula (II), X represents S or O in formula (IV), X represents S, O or C═O, and Y represents O, $CH_2$ or C═O, in formula (V), Y represents $CH_2$ or C═O, in formula (VI), X represents CH or N, and in formula (VII), Y represents $CH_2$ or C═O, and wherein:

A represents a group of formula (a)-(c), and

B represents a group of formula (d)-(f),

[a]

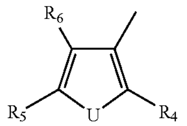

[b]

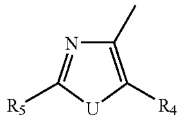

[c]

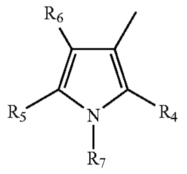

[d]

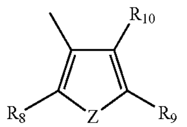

[e]

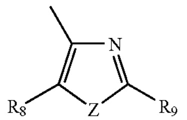

-continued

[f]

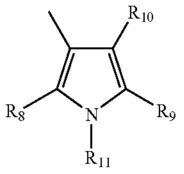

wherein:

$R_4$ represents an aryloxy group, a substituted and unsubstituted heteroaromatic group, an alkoxy group, or a substituted alkoxy group, where the alkyl portion of the alkoxy group represents a straight, branched or cyclic, substituted or unsubstituted, alkyl group of from 1 to about 40 carbon atoms, $R_5$ represents an aryl group, a substituted or unsubstituted alkylaryl group wherein hetero atoms either may or may not be present in the alkyl portion of the alkylaryl group or the aryl portion of the alkylaryl group, a cyano group, a carboxylic acid group, or an unsaturated alkene group, $R_6$ represents a hydrogen atom, an alkyl group, a halogen atom, an alkoxy group, a fluoroalkyl group, a cyano group, an aryl group, or a substituted alkylaryl group, $R_7$ represents an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl, $R_8$ represents an aryloxy group, substituted and unsubstituted heteroaromatic group, or an alkoxy group or substituted alkoxy group where the alkyl portion of the alkoxy group represents a straight, branched or cyclic, substituted or unsubstituted, alkyl group of from 1 to about 40 carbon atoms, $R_9$ represents an aryl group, a substituted or unsubstituted alkylaryl groups wherein hetero atoms either may or may not be present in the alkyl portion of the alkylaryl group or the aryl portion of the alkylaryl group, a cyano group, a carboxylic acid group, or an unsaturated alkene group, $R_{10}$ represents a hydrogen atom, an alkyl group, a halogen atom, an alkoxy group, a fluoroalkyl group, a cyano group, an aryl group, or a substituted alkylaryl group, $R_{11}$ represents an alkyl group, an aryl group, or a substituted or unsubstituted alkylaryl group wherein hetero atoms either may or may not be present in the alkyl portion of the alkylaryl group or the aryl portion of the alkylaryl, and U and Z each independently represent sulfur or oxygen.

9. The image forming medium of claim 1, wherein the photochromic material is dispersed in a polymer selected from the group consisting of polyalkylacrylates, polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, polystyrene-acrylonitrile, polyethylene-acrylate, vinylidenechloride- vinylchloride, vinylacetate-vinylidene chloride, styrene-alkyd resins, and mixtures thereof.

10. The image forming medium of claim 1, wherein the photochromic material is dissolved in a solvent selected from the group consisting of straight chain aliphatic hydrocarbons, branched chain aliphatic hydrocarbons, aromatic, halogenated, polar solvents, and mixtures thereof.

11. The image forming medium of claim 1, wherein the photochromic or photochromic-thermochromic material is present in an amount of from about 0.01% to about 20% by weight of a total weight of the imaging composition.

12. The image forming medium of claim 1, wherein the substrate is selected from the group consisting of glass, ceramic, wood, plastic, paper, fabric, textile, metals, plain paper, and coated paper.

13. A system for imaging the image forming medium of claim 1, the system comprising:

a printer comprising an imaging member that outputs the first wavelength and an erase component that outputs heat and the second wavelength, that is capable of heating and flooding the image forming medium with heat and light of the second wavelength simultaneously.

14. The system of claim 13, wherein the image forming medium contains a photochromic material which is an alkoxy substituted dithienylethene represented by the formula:

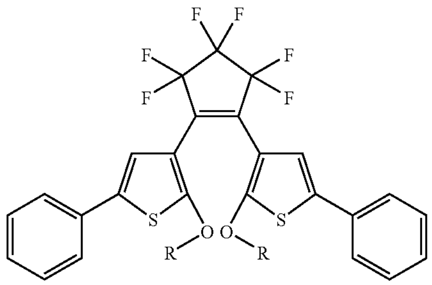

wherein each R, which can be the same or different represents an unsubstituted or substituted, straight, branched, or cyclic, alkyl group having from 1 to about 20 carbon atoms, an unsubstituted or substituted aryl group having from about 6 to about 30 carbon atoms, an unsubstituted or substituted arylalkyl group having from about 7 to about 50 carbon atoms, silyl groups, nitro groups, cyano groups, halide atoms, amine groups, hydroxy groups, alkoxy groups having from 1 to about 50 carbon atoms, aryloxy groups having from about 6 to about 30 carbon atoms, alkylthio groups having from 1 to about 50 carbon atoms, arylthio groups having from about 6 to about 30 carbon atoms, aldehyde groups, ketone groups, ester groups, amide groups, carboxylic acid groups, and sulfonic acid groups.

15. The system of claim 13, wherein the image forming medium contains a photochromic material which is represented by the general formula (I)

[I]

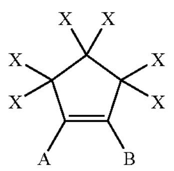

wherein:

each X independently represents hydrogen, an alkyl chain having 1 to 20 carbon atoms, bromine, chlorine or an iodine atom, A represents a group of formula (a)-(c), and B represents a group of formula (d)-(f),

[a]

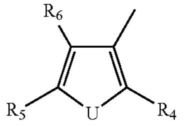

[b]

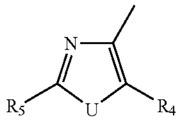

[c]

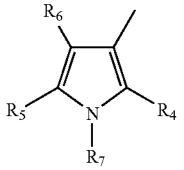

[d]

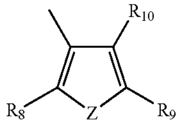

[e]

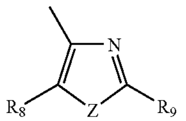

[f]

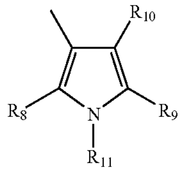

wherein:

$R_4$ represents an aryloxy group, a substituted and unsubstituted heteroaromatic group, an alkoxy group, or a substituted alkoxy group, where the alkyl portion of the alkoxy group represents a straight, branched or cyclic, substituted or unsubstituted, alkyl group of from 1 to about 40 carbon atoms, $R_5$ represents an aryl group, a substituted or unsubstituted alkylaryl group wherein hetero atoms either may or may not be present in the alkyl portion of the alkylaryl group or the aryl portion of the alkylaryl group, a cyano group, a carboxylic acid group, or an unsaturated alkene group, $R_6$ represents a hydrogen atom, an alkyl group, a halogen atom, an alkoxy group, a fluoroalkyl group, a cyano group, an aryl group, or a substituted alkylaryl group, $R_7$ represents an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl, $R_8$ represents an aryloxy group, substituted and unsubstituted heteroaromatic group, or an alkoxy group or substituted alkoxy group where the alkyl portion of the alkoxy group represents a straight, branched or cyclic, substituted or unsubstituted, alkyl group of from 1 to about 40 carbon atoms, $R_9$ represents an aryl group, a substituted or unsubstituted alkylaryl groups wherein hetero atoms either may or may not be present in the alkyl portion of the alkylaryl group or the aryl portion of the alkylaryl group, a cyano group, a carboxylic acid group, or an unsaturated alkene group, $R_{10}$ represents a hydrogen atom, an alkyl group, a halogen atom, an alkoxy group, a fluoroalkyl group, a cyano group, an aryl group, or a substituted alkylaryl group, $R_{11}$ represents an alkyl group, an aryl group, or a substituted or unsubstituted alkylaryl group wherein hetero atoms either may or may not be present in the alkyl portion of the alkylaryl group or the aryl portion of the alkylaryl, and U and Z each independently represent sulfur or oxygen atoms.

16. The system of claim 13, wherein the image forming medium contains a photochromic material which is represented by the general formulae (II), (III), (IV), (V), (VI), (VII)

[II]

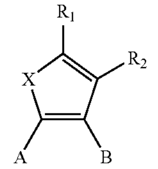

[III]

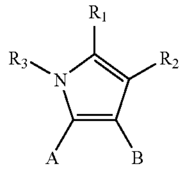

[IV]

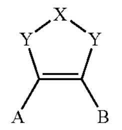

[V]

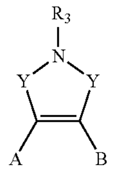

[VI]

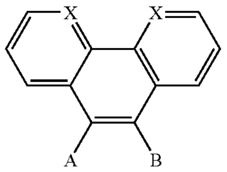

[VIII]

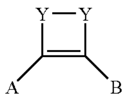

wherein:

in formula (II), X represents S or O, in formula (IV), X represents S, O or C═O, and Y represents O, $CH_2$ or C═O, in formula (V), Y represents $CH_2$ or C═O, in formula (VI), X represents CH or N, and in formula (VII), Y represents $CH_2$ or C═O, and wherein:

A represents a group of formula (a)-(c), and

B represents a group of formula (d)-(f),

[a]

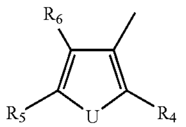

[b]

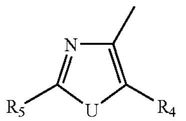

[c]

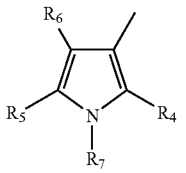

[d]

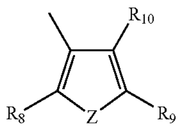

[e]

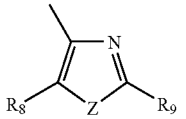

[f]

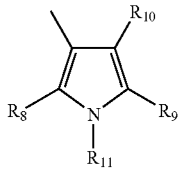

wherein:

$R_4$ represents an aryloxy group, a substituted and unsubstituted heteroaromatic group, an alkoxy group, or a substituted alkoxy group, where the alkyl portion of the alkoxy group represents a straight, branched or cyclic, substituted or unsubstituted, alkyl group of from 1 to about 40 carbon atoms, $R_5$ represents an aryl group, a substituted or unsubstituted alkylaryl group wherein hetero atoms either may or may not be present in the alkyl portion of the alkylaryl group or the aryl portion of the alkylaryl group, a cyano group, a carboxylic acid group, or an unsaturated alkene group, $R_6$ represents a hydrogen atom, an alkyl group, a halogen atom, an alkoxy group, a fluoroalkyl group, a cyano group, an aryl group, or a substituted alkylaryl group, $R_7$ represents an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl, $R_8$ represents an aryloxy group, substituted and unsubstituted heteroaromatic group, or an alkoxy group or substituted alkoxy group where the alkyl portion of the alkoxy group represents a straight, branched or cyclic, substituted or unsubstituted, alkyl group of from 1 to about 40 carbon atoms, $R_9$ represents an aryl group, a substituted or unsubstituted alkylaryl groups wherein hetero atoms either may or may not be present in the alkyl portion of the alkylaryl group or the aryl portion of the alkylaryl group, a cyano group, a carboxylic acid group, or an unsaturated alkene group, $R_{10}$ represents a hydrogen atom, an alkyl group, a halogen atom, an alkoxy group, a fluoroalkyl group, a cyano group, an aryl group, or a substituted alkylaryl group, $R_{11}$ represents an alkyl group, an aryl group, or a substituted or unsubstituted alkylaryl group wherein hetero atoms either may or may not be present in the alkyl portion of the alkylaryl group or the aryl portion of the alkylaryl, and U and Z each independently represent sulfur or oxygen.

17. A system for imaging the image forming medium of claim 1, the system comprising:

a printer comprising an imaging member that outputs the first wavelength and an erase lamp that outputs heat and the second wavelength, that is capable of heating and flooding the image forming medium with heat and light of the second wavelength simultaneously.

18. The system of claim 17, wherein the image forming medium contains a photochromic material which is an alkoxy substituted dithienylethene represented by the formula:

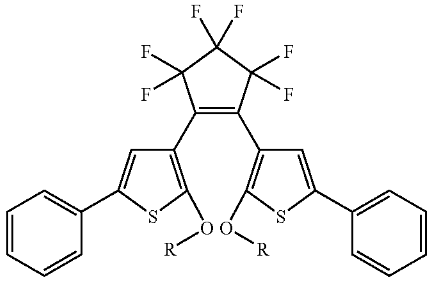

wherein each R, which can be the same or different represents an unsubstituted or substituted, straight, branched, or cyclic, alkyl group having from 1 to about 20 carbon atoms, an unsubstituted or substituted aryl group having from about 6 to about 30 carbon atoms, an unsubstituted or substituted arylalkyl group having from about 7 to about 50 carbon atoms, silyl groups, nitro groups, cyano groups, halide atoms, amine groups, hydroxy groups, alkoxy groups having from 1 to about 50 carbon atoms, aryloxy groups having from about 6 to about 30 carbon atoms, alkylthio groups having from 1 to about 50 carbon atoms, arylthio groups having from about 6 to about 30 carbon atoms, aldehyde groups, ketone groups, ester groups, amide groups, carboxylic acid groups, and sulfonic acid groups.

19. The system of claim 17, wherein the image forming medium contains a photochromic material which is represented by the general formula (I)

[I]

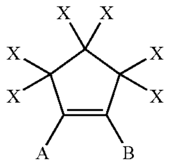

wherein:

each X independently represents hydrogen, an alkyl chain having 1 to 20 carbon atoms, bromine, chlorine or an iodine atom, A represents a group of formula (a)-(c), and B represents a group of formula (d)-(f),

[a]

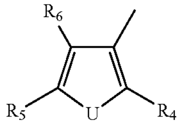

[b]

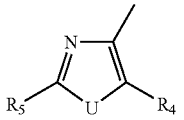

[c]

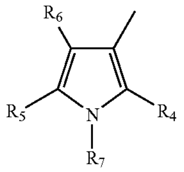

[d]

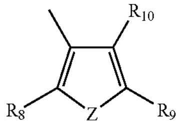

[e]

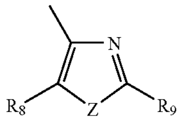

[f]

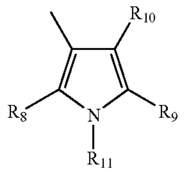

wherein:

$R_4$ represents an aryloxy group, a substituted and unsubstituted heteroaromatic group, an alkoxy group, or a substituted alkoxy group, where the alkyl portion of the alkoxy group represents a straight, branched or cyclic, substituted or unsubstituted, alkyl group of from 1 to about 40 carbon atoms, $R_5$ represents an aryl group, a substituted or unsubstituted alkylaryl group wherein hetero atoms either may or may not be present in the alkyl portion of the alkylaryl group or the aryl portion of the alkylaryl group, a cyano group, a carboxylic acid group, or an unsaturated alkene group, $R_6$ represents a hydrogen atom, an alkyl group, a halogen atom, an alkoxy group, a fluoroalkyl group, a cyano group, an aryl group, or a substituted alkylaryl group, $R_7$ represents an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl, $R_8$ represents an aryloxy group, substituted and unsubstituted heteroaromatic group, or an alkoxy group or substituted alkoxy group where the alkyl portion of the alkoxy group represents a straight, branched or cyclic, substituted or unsubstituted, alkyl group of from 1 to about 40 carbon atoms, $R_9$ represents an aryl group, a substituted or unsubstituted alkylaryl groups wherein hetero atoms either may or may not be present in the alkyl portion of the alkylaryl group or the aryl portion of the alkylaryl group, a cyano group, a carboxylic acid group, or an unsaturated alkene group, $R_{10}$ represents a hydrogen atom, an alkyl group, a halogen atom, an alkoxy group, a fluoroalkyl group, a cyano group, an aryl group, or a substituted alkylaryl group, $R_{11}$ represents an alkyl group, an aryl group, or a substituted or unsubstituted alkylaryl group wherein hetero atoms either may or may not be present in the alkyl portion of the alkylaryl group or the aryl portion of the alkylaryl, and U and Z each independently represent sulfur or oxygen atoms.

20. The system of claim 17, wherein the image forming medium contains a photochromic material which is represented by the general formulae formulae (II), in formula (II), (III), (IV), (V), (VI), (VII)

[II]

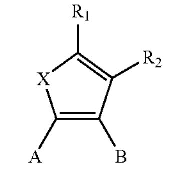

[III]

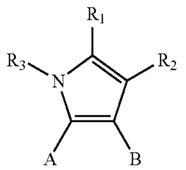

[IV]

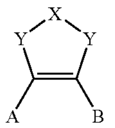

[V]

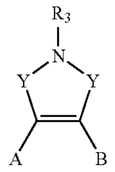

-continued

[VI]

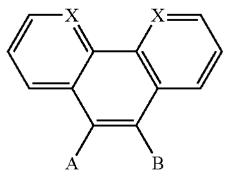

[VII]

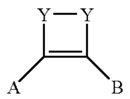

wherein:

in formula (II), X represents S or O, in formula (IV), X represents S, O or C═O, and Y represents O, $CH_2$ or C═O, in formula (V), Y represents $CH_2$ or C═O, in formula (VI), X represents CH or N, and in formula (VII), Y represents $CH_2$ or C═O, and wherein:

A represents a group of formula (a)-(c), and

B represents a group of formula (d)-(f),

[a]

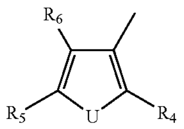

[b]

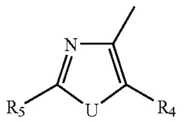

[c]

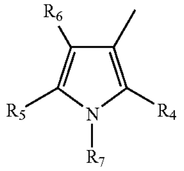

[d]

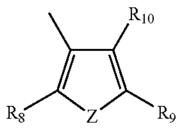

[e]

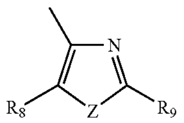

[f]

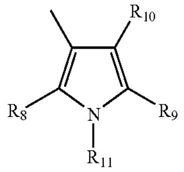

wherein:

$R_4$ represents an aryloxy group, a substituted and unsubstituted heteroaromatic group, an alkoxy group, or a substituted alkoxy group, where the alkyl portion of the alkoxy group represents a straight, branched or cyclic, substituted or unsubstituted, alkyl group of from 1 to about 40 carbon atoms, $R_5$ represents an aryl group, a substituted or unsubstituted alkylaryl group wherein hetero atoms either may or may not be present in the alkyl portion of the alkylaryl group or the aryl portion of the alkylaryl group, a cyano group, a carboxylic acid group, or an unsaturated alkene group, $R_6$ represents a hydrogen atom, an alkyl group, a halogen atom, an alkoxy group, a fluoroalkyl group, a cyano group, an aryl group, or a substituted alkylaryl group, $R_7$ represents an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl, $R_8$ represents an aryloxy group, substituted and unsubstituted heteroaromatic group, or an alkoxy group or substituted alkoxy group where the alkyl portion of the alkoxy group represents a straight, branched or cyclic, substituted or unsubstituted, alkyl group of from 1 to about 40 carbon atoms, $R_9$ represents an aryl group, a substituted or unsubstituted alkylaryl groups wherein hetero atoms either may or may not be present in the alkyl portion of the alkylaryl group or the aryl portion of the alkylaryl group, a cyano group, a carboxylic acid group, or an unsaturated alkene group, $R_{10}$ represents a hydrogen atom, an alkyl group, a halogen atom, an alkoxy group, a fluoroalkyl group, a cyano group, an aryl group, or a substituted alkylaryl group, $R_{11}$ represents an alkyl group, an aryl group, or a substituted or unsubstituted alkylaryl group wherein hetero atoms either may or may not be present in the alkyl portion of the alkylaryl group or the aryl portion of the alkylaryl, and U and Z each independently represent sulfur or oxygen

21. The image forming medium of claim 1, wherein the first wavelength is from 200 to 500 nanometers and the second wavelength is from 501 to 800 nanometers.

22. The image forming medium of claim 1, wherein the first wavelength is from 300 to 399 nanometers and the second wavelength is from 400 to 800 nanometers.

23. The image forming medium of claim 1, wherein the short time period is the time period for the maximum absorbance of the imaging composition in the region 400-800 nm to be reduced from its initial absorbance to one half of the initial absorbance, in about 5 minutes or less.

24. The image forming medium of claim 1, wherein the solvent mixture is provided in the form of encapsulated amounts of the solvent

* * * * *